US012748997B2

(12) United States Patent
Kannan et al.

(10) Patent No.: US 12,748,997 B2
(45) Date of Patent: Sep. 29, 2026

(54) MANAGING COUPLING IN A QUANTUM COMPUTING SYSTEM

(71) Applicant: Google LLC, Mountain View, CA (US)

(72) Inventors: Bharath Kannan, Cambridge, MA (US); Youngkyu Sung, Cambridge, MA (US); Leon Chen Ding, Cambridge, MA (US)

(73) Assignee: GOOGLE LLC, Mountain View, CA (US)

( * ) Notice: Subject to any disclaimer, the term of this patent is extended or adjusted under 35 U.S.C. 154(b) by 328 days.

(21) Appl. No.: 18/477,592

(22) Filed: Sep. 29, 2023

(65) Prior Publication Data

US 2024/0289669 A1 Aug. 29, 2024

Related U.S. Application Data

(60) Provisional application No. 63/521,155, filed on Jun. 15, 2023, provisional application No. 63/412,573, filed on Oct. 3, 2022.

(51) Int. Cl.
*G06N 10/40* (2022.01)
*H10N 60/80* (2023.01)

(52) U.S. Cl.
CPC ........... *G06N 10/40* (2022.01); *H10N 60/805* (2023.02)

(58) Field of Classification Search
CPC ....... G06N 10/40; G06N 10/00; H10N 60/805
See application file for complete search history.

(56) References Cited

U.S. PATENT DOCUMENTS

| | | | | |
|---|---|---|---|---|
| 7,912,656 | B2 | 3/2011 | Berns et al. | |
| 9,940,212 | B2 | 4/2018 | Kelly | |
| 10,134,972 | B2 | 11/2018 | Oliver et al. | |
| 10,572,816 | B1 * | 2/2020 | Vavilov | G06N 10/70 |
| 10,658,424 | B2 | 5/2020 | Oliver et al. | |
| 2019/0007051 | A1 * | 1/2019 | Sete | H03K 19/195 |
| 2019/0294991 | A1 * | 9/2019 | Filipp | H03K 3/38 |
| 2022/0269968 | A1 * | 8/2022 | Noguchi | H10N 69/00 |
| 2024/0086751 | A1 * | 3/2024 | Finck | G06N 10/40 |

(Continued)

OTHER PUBLICATIONS

L. Ding et al., "High-Fidelity, Frequency-Flexible Two-Qubit Fluxonium Gates with a Transmon Coupler", arXiv, Phys. Rev. X, vol. 13, pp. 1-23, 2023, DOI: 10.1103/PhysRevX.13.031035.

(Continued)

*Primary Examiner* — Seokjin Kim
(74) *Attorney, Agent, or Firm* — DORITY & MANNING, P.A.

(57) ABSTRACT

An apparatus comprises: an array of coupled quantum elements in a housing configured to provide a low-temperature environment, where at least one of the quantum elements comprises: a first fluxonium qubit circuit, and a qubit coupling circuit configured to couple the first fluxonium qubit circuit to a second fluxonium qubit circuit, where the qubit coupling circuit comprises a tunable superconducting circuit that has at least one tunable characteristic; and a control module configured to apply magnetic flux pulses to quantum elements in the array of coupled quantum elements based at least in part on digital control signals received from a digital signal interface providing the digital control signals into the housing.

47 Claims, 19 Drawing Sheets

(56) References Cited

U.S. PATENT DOCUMENTS

2024/0311673 A1* 9/2024 Salim ....................... G06N 3/09

OTHER PUBLICATIONS

F. Battistel et al., "A Hardware-Efficient Leakage-Reduction Scheme for Quantum Error Correction with Superconducting Transmon Qubits", arXiv, PRX Quantum, vol. 2, Issue 3, pp. 1-24, 2021, DOI: 10.1103/prxquantum.2.030314.

Google Quantum AI "Suppressing quantum errors by scaling a surface code logical qubit" Nature, vol. 614, pp. 676-681, 2023. https://doi.org/10.1038/s41586-022-05434-1.

M. McEwen et al., "Removing leakage-induced correlated errors in superconducting quantum error correction", Nat Commun, vol. 12, Issue 1761, pp. 1-7, 2021, DOI: https://doi.org/10.1038/s41467-021-21982-y.

L. DiCarlo et al., "Demonstration of two-qubit algorithms with a superconducting quantum processor", Nature, vol. 460, pp. 240-244, 2009, DOI: https://doi.org/10.1038/nature08121.

Y. Sung et al., "Realization of High-Fidelity CZ and ZZ-Free iSWAP Gates with a Tunable Coupler", American Physical Society, Phys. Rev. X, vol. 11, Issue 2, pp. 1-32, 2021, DOI: https://doi.org/10.1103/PhysRevX.11.021058.

B. Foxen et al., "Demonstrating a Continuous Set of Two-Qubit Gates for Near-Term Quantum Algorithms", American Physical Society, Phys. Rev. Lett., vol. 125, Issue 12, pp. 1-6, 2020, DOI: https://doi.org/10.1103/PhysRevLett. 125.120504.

E. Dogan et al., "Demonstration of the Two-Fluxonium Cross-Resonance Gate", arXiv, Phys. Rev. Appl., pp. 1-17, 2022, DOI: arxiv-2204.11829v1.

F. Bao et al., "Fluxonium: An Alternative Qubit Platform for High-Fidelity Operations", Phys. Rev. Lett., vol. 129, pp. 1-6, Jun. 28, 2022, DOI: 10.1103/PhysRevLett.129.010502.

J. M. Chow et al., "Microwave-activated conditional-phase gate for superconducting qubits", IOP, New Journal of Physics, vol. 15, No. 11, pp. 1-10, 2013, DOI: 10.1088/1367-2630/15/11/115012.

N. Takeuchi et al., "Adiabatic Quantum-Flux-Parametron: A Tutorial Review", IEICE Transactions on Electronics, vol. E105.C., No. 6, pp. 251-263, 2022, DOI: 10.1587/transele.2021SEP0003.

C. L. Ayala et al., "MANA: A Monolithic Adiabatic integration Architecture Microprocessor Using 1.4-zJ/op Unshunted Superconductor Josephson Junction Devices," in IEEE Journal of Solid-State Circuits, vol. 56, No. 4, pp. 1152-1165, Apr. 2021, DOI: 10.1109/JSSC.2020.3041338.

V. E. Manucharyan et al., "Fluxonium: Single Cooper-Pair Circuit Free of Charge Offsets", American Association for the Advancement of Science, Science, vol. 326, 5 pgs., Oct. 2, 2009, DOI: 10.1126/science.1175552.

X. Zhang et al., "A scalable superconducting quantum simulator with long-range connectivity based on a photonic bandgap metamaterial", arXiv, Science, vol. 379, 34 pgs, Aug. 18, 2022, DOI: 10.1126/science.ade7651.

D. K. Weiss et al., "Fast High-Fidelity Gates for Galvanically-Coupled Fluxonium Qubits Using Strong Flux Modulation", arXiv, American Physical Society, PRX Quantum, vol. 3. 18 pages, Jul. 8, 2022, DOI: 10.1103/prxquantum.3.040336.

H. Xiong et al., "Arbitrary controlled-phase gate on fluxonium qubits using differential ac Stark shifts", Phys. Rev. Research, vol. 4, 16 pgs., Apr. 15, 2022, DOI: 10.1103/PhysRevResearch.4.023040.

Q. Ficheux et al., "Fast Logic with Slow Qubits: Microwave-Activated Controlled-Z Gate on Low-Frequency Fluxoniums", American Physical Society, Phys. Rev. X, vol. 11, 16 pgs., May 3, 2021, DOI: 10.1103/PhysRevX.11.021026.

D. L. Campbell et al., "Universal Nonadiabatic Control of Small-Gap Superconducting Qubits", American Physical Society, Phys. Rev. X, vol. 10, 9 pgs., Dec. 14, 2020, DOI: 10.1103/PhysRevX.10.041051.

L. B. Nguyen et al., "High-Coherence Fluxonium Qubit", American Physical Society, Phys. Rev. X, vol. 9, 14 pgs., Nov. 25, 2019, DOI: 10.1103/PhysRevX.9.041041.

* cited by examiner

| | $E_J$ (GHz) | $E_C$ (GHz) | $E_L$ (GHz) |
|---|---|---|---|
| Fluxonium qubit 1 | 4.0 | 0.854 | 0.629 |
| Fluxonium qubit 2 | 4.0 | 0.854 | 0.308 |
| Tunable coupler (flux-tunable transmon) | $E_{J,c1}$=12.5 GHz $E_{J,c2}$=12.5 GHz | 0.331 | N.A. |

FIG. 5D

| | $E_J$ (GHz) | $E_C$ (GHz) | $E_L$ (GHz) |
|---|---|---|---|
| Fluxonium qubit 1 | 4.0 | 0.854 | 0.629 |
| Fluxonium qubit 2 | 5.5 | 0.854 | 0.706 |
| Tunable coupler (flux-tunable transmon) | $E_{J,c1}$=15 GHz $E_{J,c2}$=15 GHz | 0.331 | N.A. |

FIG. 5E

| | $J_{1c}$ (GHz) | $J_{2c}$ (GHz) | $J_{12}$ (GHz) |
|---|---|---|---|
| Coupling strength | 0.528 | 0.528 | 0.161 |

FIG. 5F

MANAGING COUPLING IN A QUANTUM COMPUTING SYSTEM

CROSS-REFERENCE TO RELATED APPLICATION(S)

This application claims priority to and the benefit of U.S. Provisional Application Ser. No. 63/412,573, entitled "MANAGING COUPLING, CONTROL, CALIBRATION, AND BENCHMARKING OF A QUANTUM COMPUTING SYSTEM," filed Oct. 3, 2022, and to U.S. Provisional Application Ser. No. 63/521,155, entitled "MANAGING COUPLING IN A QUANTUM COMPUTING SYSTEM," filed Jun. 15, 2023, each of which is incorporated herein by reference.

TECHNICAL FIELD

This disclosure relates to managing coupling of quantum elements in a quantum computing system.

BACKGROUND

Quantum computing systems are generally configured to execute quantum operations on coupled quantum elements storing and manipulating quantum states associated with a set of connected quantum bits (also called qubits). Each qubit corresponds to a quantum system with two or more states, two or more of which can be initialized and brought into superposition in a controlled manner. A single-qubit gate can be used to apply a quantum operation that changes the state of a single qubit. When measured, the wave function associated with a qubit collapses into one of the states in the superposition according to a probability that is based on the wave function. A qubit can also enter into an entangled state with one or more other qubits. A multi-qubit gate (e.g., a two-qubit gate) can be used to apply a quantum operation that changes the states of qubits at its input, for example, to bring the qubits into a particular entangled state or to otherwise change the states of the qubits. Combinations of quantum logic gates and measurement enable the realization of quantum algorithms, which can be specified using one or more collections of interconnected quantum gates (also called "quantum circuit programs" which can represent a high-level specification of operations performed on a physical device, but are generally different from the actual physical implementation of qubit circuits or other quantum device circuitry). In some systems, quantum elements can be configured such that multiple qubits associated with different respective quantum elements are combined in a predetermined manner to represent a single logical qubit or error-corrected qubit, and quantum algorithms can be performed with respect to the logical qubits or error-corrected qubits.

SUMMARY

In one aspect, in general, an apparatus comprises: an array of coupled quantum elements in a housing configured to provide a low-temperature environment, where at least one of the quantum elements comprises: a first fluxonium qubit circuit, and a qubit coupling circuit configured to couple the first fluxonium qubit circuit to a second fluxonium qubit circuit, where the qubit coupling circuit comprises a tunable superconducting circuit that has at least one tunable characteristic; and a control module configured to apply magnetic flux pulses to quantum elements in the array of coupled quantum elements based at least in part on digital control signals received from a digital signal interface providing the digital control signals into the housing.

Aspects can include one or more of the following features.

The tunable superconducting circuit has a tunable frequency, where the frequency is associated with a transition between energy levels of quantum states associated with at least one of the first fluxonium qubit circuit, the second fluxonium qubit circuit, or the qubit coupling circuit.

The tunable frequency is tunable based at least in part on a magnetic flux through an inductive element of the qubit coupling circuit.

The tunable superconducting circuit comprises a superconducting quantum interference device (SQUID).

The tunable superconducting circuit comprises a direct current (DC) SQUID.

The tunable superconducting circuit comprises a capacitively shunted DC SQUID.

The tunable superconducting circuit comprises a transmon qubit circuit.

The qubit coupling circuit is configured to capacitively couple to the first fluxonium qubit circuit and to the second fluxonium qubit circuit.

The housing configured to provide a low-temperature environment comprises a cryogenic chamber configured to maintain a temperature of the low-temperature environment below about 1 Kelvin.

The array of coupled quantum elements is arranged such that quantum elements that are nearest-neighbors to one another comprise respective quantum states with first excited states that substantially differ in energy.

In another aspect, in general, a method comprises: receiving digital control signals from a digital signal interface providing the digital control signals into a housing configured to provide a low-temperature environment; and applying magnetic flux pulses to quantum elements in an array of coupled quantum elements based at least in part on the digital control signals; where the array of coupled quantum elements is located within the housing, and where at least one of the quantum elements comprises: a first fluxonium qubit circuit, and a qubit coupling circuit configured to couple the first fluxonium qubit circuit to a second fluxonium qubit circuit, where the qubit coupling circuit comprises a tunable superconducting circuit that has at least one tunable characteristic.

Aspects can include one or more of the following features.

The tunable superconducting circuit has a tunable frequency, and where the frequency is associated with a transition between energy levels of quantum states associated with at least one of the first fluxonium qubit circuit, the second fluxonium qubit circuit, or the qubit coupling circuit.

The tunable frequency is tunable based at least in part on a magnetic flux through an inductive element of the qubit coupling circuit.

The tunable superconducting circuit comprises a superconducting quantum interference device (SQUID).

The tunable superconducting circuit comprises a direct current (DC) SQUID.

The tunable superconducting circuit comprises a capacitively shunted DC SQUID.

The tunable superconducting circuit comprises a transmon qubit circuit.

The qubit coupling circuit is configured to capacitively couple to the first fluxonium qubit circuit and to the second fluxonium qubit circuit.

The housing configured to provide a low-temperature environment comprises a cryogenic chamber configured to maintain a temperature of the low-temperature environment below about 1 Kelvin.

The array of coupled quantum elements is arranged such that quantum elements that are nearest-neighbors to one another comprise respective quantum states with first excited states that substantially differ in energy.

In another aspect, in general, a method for performing at least one quantum gate operation on a quantum processor comprises: applying a first magnetic field flux pulse through a first inductive loop associated with a first superconducting circuit; and where, during a portion of the first magnetic field flux pulse, a first energy associated with a first multi-qubit state comprises an excited state of the first superconducting circuit and a state of a second superconducting circuit is substantially equal to a second energy associated with a second multi-qubit state comprising a ground state of the first superconducting circuit and an excited state of the second superconducting circuit.

Aspects can include one or more of the following features.

The first superconducting circuit and the second superconducting circuit are capacitively coupled.

The state of the second superconducting circuit is either (1) a ground state or (2) a singly-excited state, and where the excited state of the second superconducting circuit is either (1) a singly-excited state or (2) a doubly-excited state.

The magnetic flux quantum is equal to Plank's constant divided by twice the charge of an electron.

At least one of the first magnetic flux pulse and the second magnetic flux pulse has a magnetic flux amplitude that is centered around the initial magnetic flux value.

The method further comprises: modifying both (1) a first effective coupling strength between the first superconducting circuit and a third superconducting circuit, and (2) a second effective coupling strength between the second superconducting circuit and the third superconducting circuit, the modifying comprising: applying a second magnetic field flux pulse through a second inductive loop associated with the third superconducting circuit.

The first effective coupling strength is associated with a first rate at which quantum state population between a first quantum state of the first superconducting circuit and a second quantum state of the third superconducting circuit are transferred, and where the second effective coupling strength is associated with a second rate at which quantum state population between a third quantum state of the third superconducting circuit and a fourth quantum state of the second superconducting circuit are transferred.

The second quantum state of the third superconducting circuit and the third quantum state of the third superconducting circuit are the same.

The first superconducting circuit and the third superconducting circuit are capacitively coupled, and the second superconducting circuit and the third superconducting circuit are capacitively coupled.

The first superconducting circuit and the second superconducting circuit are capacitively coupled.

A first duration of the first magnetic field flux pulse and a second duration of the second magnetic field pulse are each based at least in part on the first effective coupling strength and the second effective coupling strength.

during the modifying, at least one of the first effective coupling strength and the second effective coupling strength is greater than or equal to the respective effective coupling strength before the modifying.

A quantum state associated with the third superconducting circuit is substantially in a ground state before and after the modifying.

The first effective coupling strength and the second effective coupling strength modify a third effective coupling strength between the first superconducting circuit and the second superconducting circuit.

The third effective coupling strength is associated with a rate at which quantum state population between a first quantum state of the first superconducting circuit and a second quantum state of the second superconducting circuit are transferred.

The two-qubit quantum gate operation temporarily modifies the third effective coupling strength during application of at least one of the first magnetic field flux pulse or the second magnetic field flux pulse.

The method further comprises: measuring one or more properties associated with at least one of (1) the first quantum state or (2) the second quantum state, after one or more magnetic field flux pulses, and modifying at least one of the first magnetic field flux pulse or the second magnetic field flux pulse based at least in part on the measurement.

The one or more properties comprise at least one of (1) leakage, (2) a controlled-phase angle, or (3) a rate at which quantum state population is transferred between the first multi-qubit state and the second multi-qubit state.

Applying at least one of the first magnetic field flux pulse or the second magnetic field flux pulse results in a phase shift to a first quantum state associated with the first superconducting circuit that depends at least in part on a second quantum state associated with the second superconducting circuit.

Applying at least one of the first magnetic field flux pulse or the second magnetic field flux pulse applies a quantum gate operation that swaps (1) a first quantum state associated with the first superconducting circuit and (2) a second quantum state associated with the second superconducting circuit.

At least one of the first magnetic field flux pulse and the second magnetic field flux pulse has a frequency below 1 GHz.

The method further comprises: applying a third magnetic field flux pulse through a third inductive loop associated with the second superconducting circuit.

The first, second, or third magnetic field flux pulses comprise a controlled-phase quantum gate operation associated with the quantum state, wherein an angle associated with the controlled-phase quantum gate operation is determined at least in part on an amplitude of at least one of the first, second, or third magnetic field flux pulses.

Applying at least one of the first magnetic field flux pulse or the second magnetic field flux pulse applies a quantum gate operation that transfers quantum state population between the first multi-qubit state and the second multi-qubit state.

The one or more single-qubit quantum gate operations comprise applying a fourth magnetic field flux pulse through the first inductive loop associated with the first superconducting circuit.

The method further comprises: determining a program specification comprising one or more quantum gate operations and applying at least one of the first magnetic field flux pulse or the second magnetic field flux pulse based at least in part on the program specification.

The program specification comprises one or more single-qubit quantum gate operations comprising applying a fourth magnetic field flux pulse through the first inductive loop.

The one or more single-qubit quantum gate operations are the inverse of a second single-qubit quantum gate operation that is not within the program specification and that results from one or more applied magnetic field flux pulses.

The fourth magnetic field flux pulse is applied before or after the first magnetic field flux pulse or the second magnetic field flux pulse.

The method further comprises: applying the fourth magnetic field flux pulse before the first magnetic flux pulse, and performing one or more single-qubit quantum gate operations by applying a fifth magnetic field flux pulse through the first inductive loop after the first magnetic field flux pulse.

The fourth magnetic field flux pulse performs a Hadamard quantum gate operation on a quantum state associated with the first superconducting circuit, the first magnetic field flux pulse performs, at least in part, a controlled-Z quantum gate operation associated with the quantum state, and the fifth magnetic field flux pulse performs a Hadamard quantum gate operation on the quantum state.

The first, fourth, and fifth magnetic field flux pulses comprise a CNOT quantum gate operation associated with the quantum state.

Determining the program specification comprises estimating single-qubit quantum gate operations that occur during application of at least one or more multi-qubit quantum gate operations within the program specification.

Determining the program specification further comprises modifying at least one multi-qubit quantum gate operation based at least in part on the estimated single-qubit quantum gate operation that occurs during the application of the multi-qubit quantum gate operation.

In another aspect, in general, an apparatus comprises: an array of coupled quantum elements comprising a first superconducting circuit, and a second superconducting circuit; and a control module configured to apply magnetic flux pulses to quantum elements in the array of coupled quantum elements, the magnetic flux pulses comprising a first magnetic flux pulse; where, during a portion of the first magnetic field flux pulse, a first energy associated with a first multi-qubit state comprising an excited state of the first superconducting circuit and a state of a second superconducting circuit is substantially equal to a second energy associated with a second multi-qubit state comprising a ground state of the first superconducting circuit and an excited state of the second superconducting circuit.

Aspects can include one or more of the following features.

The first magnetic field flux pulse is through a first inductive loop associated with the first superconducting circuit.

The first superconducting circuit and the second superconducting circuit are capacitively coupled.

The first magnetic field flux pulse has a frequency below 1 GHz.

The magnetic flux pulses further comprise a second magnetic flux pulse through a second inductive loop associated with a third superconducting circuit 60. The first superconducting circuit and the third superconducting circuit are capacitively coupled, and the second superconducting circuit and the third superconducting circuit are capacitively coupled.

The second magnetic flux pulse modifies at least one of (1) a first effective coupling strength between the first superconducting circuit and the third superconducting circuit, or (2) a second effective coupling strength between the second superconducting circuit and the third superconducting circuit.

The first effective coupling strength and the second effective coupling strength modify a third effective coupling strength between the first superconducting circuit and the second superconducting circuit.

The third effective coupling strength is associated with a rate at which quantum state population between a first quantum state of the first superconducting circuit and a second quantum state of the second superconducting circuit are transferred.

The first effective coupling strength is associated with a first rate at which quantum state population between a first quantum state of the first superconducting circuit and a second quantum state of the third superconducting circuit are transferred, and where the second effective coupling strength is associated with a second rate at which quantum state population between a third quantum state of the third superconducting circuit and a fourth quantum state of the second superconducting circuit are transferred.

A quantum state associated with the third superconducting circuit is substantially in a ground state before and after the modifying.

The magnetic flux pulses further comprise a third magnetic field flux pulse through a third inductive loop associated with the second superconducting circuit.

The magnetic flux pulses perform a two-qubit quantum gate operation acting on a first quantum state associated with the first superconducting circuit and a second quantum state associated with the second superconducting circuit.

In another aspect, in general, an apparatus comprises: an array of coupled quantum elements in a housing configured to provide a low-temperature environment, where at least one of the quantum elements comprises: a generalized flux qubit circuit comprising a Josephson junction electrically connected in parallel with (1) a capacitive element and (2) an array of Josephson junctions, wherein a number of Josephson junctions forming the array of Josephson junctions is greater than two; and a control module configured to apply magnetic flux pulses to quantum elements in the array of coupled quantum elements based at least in part on digital control signals received from a digital signal interface providing the digital control signals into the housing.

Aspects can include one or more of the following features.

The generalized flux qubit circuit is configured to couple the first fluxonium qubit circuit to the second fluxonium qubit circuit.

At least one of the first fluxonium qubit circuit, the second fluxonium qubit circuit, or the generalized flux qubit circuit comprise one or more properties determined based at least in part on at least one performance characteristic associated with one or more two-qubit quantum gate operations.

The one or more properties comprise at least one of a Josephson energy, a capacitive energy, or an inductive energy.

The one or more properties are determined at least in part on a size or oxide thickness of a Josephson junction, a size of a capacitor, or a number of array junctions forming a Josephson junction.

The magnetic flux pulses comprise a first magnetic flux pulse through a first inductive loop associated with the first fluxonium qubit circuit.

during a portion of the first magnetic field flux pulse, a first energy associated with a first multi-qubit state comprising a first excited state of the first fluxonium qubit circuit and a first excited state of a second fluxonium qubit circuit is substantially equal to a second energy associated with a second multi-qubit state comprising a ground state of the first fluxonium qubit circuit and a second excited state of the second fluxonium qubit circuit.

The first fluxonium qubit circuit and the second fluxonium qubit circuit are capacitively coupled.

The magnetic flux pulses comprise a second magnetic flux pulse through a second inductive loop associated with the generalized flux qubit circuit that modifies at least one of (1) a first effective coupling strength between the first fluxonium qubit circuit and the generalized flux qubit circuit, or (2) a second effective coupling strength between the second fluxonium qubit circuit and the generalized flux qubit circuit.

The first effective coupling strength and the second effective coupling strength modify a third effective coupling strength between the first fluxonium qubit circuit and the second fluxonium qubit circuit.

The third effective coupling strength is associated with a rate at which quantum state population between a first quantum state of the first fluxonium qubit circuit and a second quantum state of the second fluxonium qubit circuit are transferred.

A quantum state associated with generalized flux qubit circuit is substantially in a ground state before and after the modifying.

The first effective coupling strength is associated with a first rate at which quantum state population between a first quantum state of the first fluxonium qubit circuit and a second quantum state of the generalized flux qubit circuit are transferred, and where the second effective coupling strength is associated with a second rate at which quantum state population between a third quantum state of the generalized flux qubit circuit and a fourth quantum state of the second fluxonium qubit circuit are transferred.

In another aspect, in general, a method comprises: receiving digital control signals from a digital signal interface providing the digital control signals into a housing configured to provide a low-temperature environment; and applying magnetic flux pulses to quantum elements in an array of coupled quantum elements based at least in part on the digital control signals; where the array of coupled quantum elements is located within the housing, and where at least one of the quantum elements comprises a generalized flux qubit circuit comprising a Josephson junction electrically connected in parallel with (1) a capacitive element and (2) an array of Josephson junctions, wherein a number of Josephson junctions forming the array of Josephson junctions is greater than two.

Aspects can include one or more of the following features.

The generalized flux qubit circuit is configured to couple the first fluxonium qubit circuit to the second fluxonium qubit circuit.

At least one of the first fluxonium qubit circuit, the second fluxonium qubit circuit, or the generalized flux qubit circuit comprise one or more properties determined based at least in part on at least one performance characteristic associated with one or more two-qubit quantum gate operations.

The one or more properties comprise at least one of a Josephson energy, a capacitive energy, or an inductive energy.

The one or more properties are determined at least in part on a size or oxide thickness of a Josephson junction, a size of a capacitor, or a number of array junctions forming a Josephson junction.

The magnetic flux pulses comprise a first magnetic flux pulse through a first inductive loop associated with the first fluxonium qubit circuit.

during a portion of the first magnetic field flux pulse, a first energy associated with a first multi-qubit state comprising a first excited state of the first fluxonium qubit circuit and a first excited state of a second fluxonium qubit circuit is substantially equal to a second energy associated with a second multi-qubit state comprising a ground state of the first fluxonium qubit circuit and a second excited state of the second fluxonium qubit circuit.

The first fluxonium qubit circuit and the second fluxonium qubit circuit are capacitively coupled.

The first fluxonium qubit circuit and the second fluxonium qubit circuit are inductively coupled.

The method further comprises: applying a second magnetic flux pulse through a second inductive loop associated with the generalized flux qubit circuit that modifies at least one of (1) a first effective coupling strength between the first fluxonium qubit circuit and the generalized flux qubit circuit, or (2) a second effective coupling strength between the second fluxonium qubit circuit and the generalized flux qubit circuit.

The first effective coupling strength and the second effective coupling strength modify a third effective coupling strength between the first fluxonium qubit circuit and the second fluxonium qubit circuit.

A quantum state associated with generalized flux qubit circuit is substantially in a ground state before and after the modifying.

The first effective coupling strength is associated with a first rate at which quantum state population between a first quantum state of the first fluxonium qubit circuit and a second quantum state of the generalized flux qubit circuit are transferred, and where the second effective coupling strength is associated with a second rate at which quantum state population between a third quantum state of the generalized flux qubit circuit and a fourth quantum state of the second fluxonium qubit circuit are transferred.

Aspects can have one or more of the following advantages.

Some quantum algorithms are expected to outperform some classical algorithms for certain classes of problems. Various characteristics associated with the implementation of quantum systems that execute the quantum algorithms can impact the performance of those quantum algorithms. For example, some characteristics of the physical circuitry of quantum elements in the quantum system affect the fidelity of the quantum operations applied using those quantum elements. The quantum elements and the coupling between quantum elements can be configured to provide increased fidelity. The quantum system can also be configured to include a variety of sub-systems that aid in the operation, calibration, and benchmarking of the quantum system.

Some of the example methods and embodiments described herein enable baseband control, which may simplify the quantum system by removing high-frequency signal generators and cables. For example, adiabatic quantum flux parametrons may allow for lower power dissipation and compatibility with low-frequency baseband control. Some single- and multi-qubit gates described herein may be performed by sweeping energy levels associated with quantum states near their avoided crossings.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 5D, 5E, and 5F show device parameters associated with an example quantum computing system.

DETAILED DESCRIPTION

Figure 1:
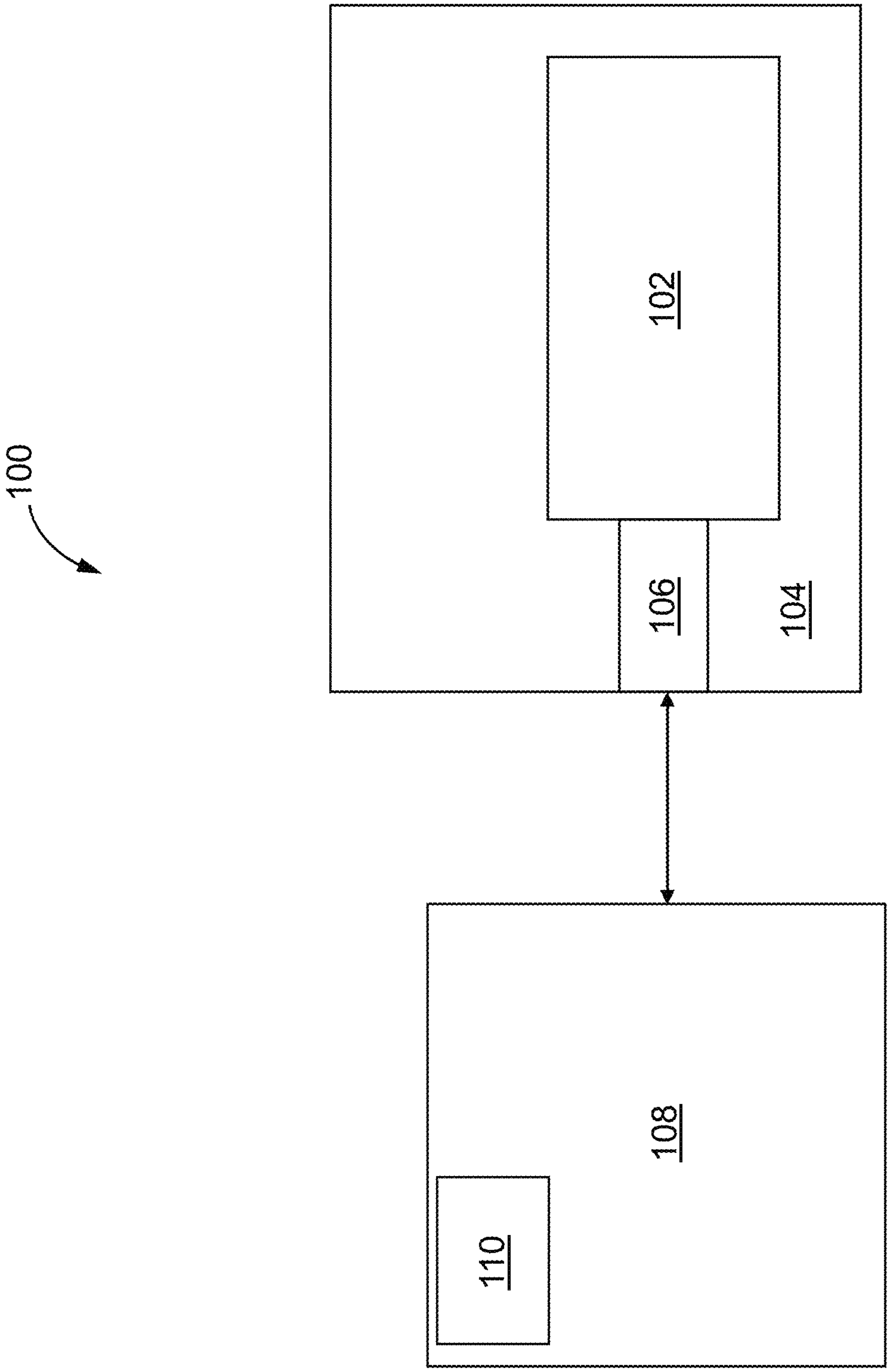
FIG. 1 is a schematic diagram of an example quantum computing system.

Quantum computers have the potential to revolutionize computation, possibly solving problems that are intractable even on modern supercomputers. However, practical applications of quantum computing, such as drug discovery, optimization, and machine learning, may be challenging to realize due to high error rates encountered in some quantum computing systems.

Superconducting qubits are one of the leading platforms for implementing quantum computers at scale. One advantage of superconducting qubits is that they can be fabricated by leveraging well-established toolsets and approaches from semiconductor manufacturing. Superconducting qubits can also perform quantum logic gates quickly, typically on the order of tens of nanoseconds.

Fluxonium, a superconducting circuit comprising a Josephson junction shunted by a capacitor and an inductor, is one of the superconducting qubit variants. A fluxonium qubit may have built-in noise protection against environmental noise sources, allowing for longer coherence times compared to conventional superconducting qubits (e.g., transmon qubits). For this reason, a fluxonium qubit is considered to be a promising building block for low-error quantum computers.

To date, however, fluxonium's long coherence times and high-fidelity logic gates have been demonstrated at a small scale. This is primarily due to the lack of a practical approach to scaling up fluxonium quantum processors while maintaining high-fidelity entangling gates and coherence advantages. Thus, there is a desire for scalable systems and methods for controlling fluxonium qubits to realize low-error quantum computers at scale.

Herein, a superconducting quantum interference device (SQUID) comprises at least one superconducting loop that includes one or more Josephson junctions.

One of the exemplary embodiments described herein includes two capacitively coupled fluxonium qubits and a tunable qubit (e.g., RF-SQUID, DC-SQUID, charge qubit, flux qubit, phase qubit, tunable transmon, gatemon, capacitively shunted flux qubit, generalized flux qubit, quarton, fluxonium, and heavy fluxonium) capacitively coupled to the fluxonium qubits, wherein the tunable qubit serves as a coupler mediating the interaction between the coupled fluxonium qubits. We refer to such an architecture as a Fluxonium-Tunable Coupler-Fluxonium (FTF) arrangement.

Exemplary embodiments include a method of implementing two-qubit gates on coupled fluxonium qubits by applying baseband magnetic flux pulses (e.g., pulses with frequencies around or below 1 GHz) to fluxonium qubits. The method relies on the interactions between two-qubit states, for example, |11>-|20>, |11>-|02>, or |10>-|01>. By applying baseband magnetic flux pulses on the qubits, the two-qubit states can be dynamically brought near/into and out of the resonance. This pulsing induces entangling interactions, such as ZZ, XY, or a combination of both, which form the basis of two-qubit gates.

The two-qubit gate method may involve using a tunable coupler to control the coupling between qubits, where an effective coupling strength is associated with the magnitude of the coupling and a phase (e.g., a sign) of the coupling is associated with a coefficient of the coupling and has a magnitude equal to one. The effective coupling strength is associated with a rate at which quantum state population between a first quantum state (e.g., of a first superconducting circuit) and a second quantum state (e.g., of a second superconducting circuit) are transferred. The quantum state population of a quantum state is equal to the square of the amplitude of the wave function associated with the quantum state. In some examples, the wave functions of different quantum states can interfere (e.g., destructively or constructively) with one another, and thus alter the quantum state population of the quantum states. In some quantum operations that involve three or more quantum states, quantum state population may be transferred between a first quantum state and a third quantum state, via a second quantum state, without placing substantial quantum state population in the second quantum state during the transfer. The effective coupling strength may depend at least in part on an inherent coupling strength that can depend on the superconducting circuits and the capacitances or inductances that connect them, for example. The effective coupling strength may also depend on two or more other effective coupling strengths (e.g., a first effective coupling strength, between a first and a second qubit, and a second effective coupling strength, between the second and a third qubit, can result in a third effective coupling strength, between the first and third qubits). The quantum state population of a quantum state characterizes the probability that measurement of a qubit associated with the quantum state will yield the quantum state. Thus, a larger quantum state population of a given quantum state translates to a larger probability of measuring a qubit to be in the given quantum state. In superconducting circuits, the flow of electric charge can be quantized and thus associated with quantum states each with respective quantum state populations. Since the flow of the electric charge results in a magnetic flux, the magnetic flux of a superconducting circuit may also be quantized and associated with quantum states.

In some examples, the effective coupling strength can be switched on and off to enable or disable qubit-qubit interaction during a two-qubit gate. The effective coupling strength can be controlled by changing the frequency of a tunable coupler, which is associated with the frequency of RF/microwave pulses for manipulating the energy associated with one or more coupler states. The effective coupling strength may depend on one or more energy differences between energy levels over which the effective coupling strength is established, modified, or eliminated. The frequency of the tunable coupler can be tuned by adjusting either the magnetic flux threading its superconducting loop (e.g., in the case of a flux-tunable coupler, such as a flux-tunable transmon, flux qubit, DC-SQUID, RF-SQUID, and fluxonium) or the voltage applied to its gate electrodes (in the case of a voltage-tunable coupler like the gatemon and charge qubit). In some examples, a quantum state associated with the tunable coupler is substantially in a ground state before and after the execution of a two-qubit gate (e.g., the ground state has more than 50% of the total population of quantum states of the tunable coupler).

Implementing two-qubit gates between two coupled (e.g., capacitively coupled) fluxonium qubits can be challenging due to the small charge matrix element associated with the transition between the ground state and the singly-excited state at flux values near the idle mode (e.g., a flux bias equal to one half of a magnetic flux quantum). A small charge matrix element may limit the coupling strength between computational states (e.g., the ground state and the singly-excited state) of the two fluxonium qubits, thereby limiting the speed at which two-qubit gate operations can be performed. Some of the two-qubit gate methods disclosed herein overcome this issue by employing baseband flux pulsing that can increase the frequency associated with the transition between the computational states to be greater than 1 GHz. The increased frequency of the transition can substantially enhance the charge matrix element of the transition and can enable couplings of the two fluxonium qubits that include contributions from non-computational states, such as the doubly-excited state. Notably, the coupling strength associated with higher energy noncomputational states can be more than five times greater than between the two computational states. Thus, the improvements derived from baseband flux pulsing may allow for stronger two-qubit interactions and the implementation of faster two-qubit gates.

The two-qubit gate method can also be implemented in a system where two fluxonium qubits are directly coupled without an intermediate tunable coupler. For explanation purposes only, an embodiment of the system with a tunable coupler, capacitively coupled to qubits, is presented herein. In general, fluxonium qubits that are capacitively coupled or inductively coupled may be used. In some example quantum computing systems, operations may be performed on more than two of a given quantum element's quantum states. These quantum systems may also be called qudits but are still referred to herein as qubits.

FIG. 1 shows an example quantum computing system 100 comprising a coupled quantum element array 102 that includes multiple quantum elements, with at least some of the quantum elements interconnected by coupling elements. The coupled quantum element array 102 may include additional circuitry to connect the qubits and couplers to external signal pathways. Such circuitry may include transmission lines, resonators, filters, charge antennas, and flux antennas, for example. The coupled quantum element array 102 can be operated as a quantum processor (i.e., a quantum chip) that is housed in a housing 104 (e.g., a cryogenically cooled chamber). A digital signal interface 106 can be used to receive digital control signals for performing baseband control and readout, as described in more detail below. A control and instrumentation system 108 can provide signals over the digital signal interface 106. In some implementations, the control and instrumentation system 108 can bypass the digital signal interface 106 and provide control signals directly to the coupled quantum element array 102. The control and instrumentation system 108 includes a memory 110 that acts as a storage medium and may store information related to the control and instrumentation system 108 and the coupled quantum element array 102. For example, the memory 110 may store a program specification (e.g., a quantum circuit program) specifying one or more algorithms comprising quantum operations. The digital signal interface 106 may also serve as a secondary control and instrumentation system, to perform tasks that may require or benefit from real-time processing where a small signal latency between the quantum processor and the instrumentation system may be desirable (e.g., to perform real-time error decoding for fault-tolerant quantum computing). The control and instrumentation system 108 may indirectly (e.g., via the digital signal interface 106) or directly perform quantum operations on one or more of the quantum elements in the coupled quantum element array 102 by applying coupling and transformation operations to a plurality of quantum states associated with the coupled quantum element array 102, according to the program specification. For example, depending on the duration of an RF pulse applied to a quantum element, the RF pulse may create a qubit corresponding to a superposition of the two quantum states (i.e., a weighted sum of the quantum states where the weights are complex numbers), or may convert one qubit value to another qubit value, such as converting $|0\rangle$ to $|1\rangle$.

Referring to FIG. 1, the quantum processor implemented by the coupled quantum element array 102 can include quantum elements implemented as an on-chip superconducting circuit. The quantum elements of the quantum processor can include a variety of types of electrical circuits. For example, the electrical circuits can include superconducting material with insulating barriers, which may be in the form of a Josephson junction. The circuits can be implemented as superconducting quantum interference devices (SQUIDs) (either direct current (DC), or radio-frequency (RF) SQUIDs), transmon quantum elements comprising Josephson junctions shunted by capacitive elements, and/or fluxonium quantum elements comprising Josephson junctions shunted by inductive and capacitive elements.

In some implementations of a quantum computing system, the individual qubit circuits of the quantum elements are fluxonium qubit circuits, which can be implemented as inductive loops containing a single, small Josephson junction connected to a large inductor, such as one formed by an array of multiple large Josephson junctions or formed from a particular material with kinetic inductance (e.g., granular aluminum, disordered superconducting nitrides). In fluxonium qubits, the qubit circuit is shunted by a capacitance and its properties (e.g., its operating frequency) are set by specific circuit parameters (e.g., inductance, capacitance, etc.). Some properties of fluxonium qubits also can be tuned in-situ by an external magnetic flux applied to one or more inductive loops associated with the fluxonium qubits. A fluxonium qubit circuit can have exceptionally long coherence times compared to the typical gate times for superconducting qubits, especially when operated at low frequencies. In some examples, operation at low frequencies (e.g., frequencies around or below 1 GHZ), also referred to as baseband control, can be used to facilitate high-fidelity single- and multi-qubit gate operations, which can simplify the quantum system by removing high-frequency signal generators and cables.

One example of baseband control is based on the physics of Landau-Zener transitions. In such examples of baseband control, two (or more) energy levels associated with respective single- or multi-qubit quantum states may be dynamically tuned to be near or in resonance with each other. If the energy levels are not coupled, they pass through each other without undergoing any state transition (i.e., there is no swapping interaction between the states even when they are rapidly brought into resonance). However, if there is a coupling between the energy levels, they repel one another and form an avoided crossing, with the energy gap at the avoided crossing being determined by the effective coupling strength between the states. At energy values where an avoided-crossing occurs, the quantum states associated with each individual energy level may be admixed into the other energy level. For energy values far away from the avoided-crossing, the mixing is negligible and the individual energy levels retain their original quantum state character. If the energy levels undergo a rapid sweep through the avoided crossing on a timescale comparable to or faster than the reciprocal of the effective coupling strength, non-adiabatic transitions between the two levels can occur. Conversely, if the sweep is slow enough, the system may not undergo any level transitions (i.e., the avoided crossing is swept adiabatically). For example, consider a system where two flux-tunable transmon qubits are electromagnetically coupled. In this system, we consider a first energy level (e.g., associated with two singly-excited transmon qubits) and a second energy level (e.g., associated with one doubly-excited transmon qubit and one ground-state transmon qubit), where the second energy level value is several GHz (e.g., 4 GHZ) higher than the first energy level value. The two energy levels may interact with each other strongly by applying a microwave flux pulse through an inductive element associated with one of the transmon qubits. In such an example, the microwave flux pulse may need to be modulated at a frequency much higher than 1 GHZ, and is typically chosen to be equal or close to either (1) the energy difference between the two energy levels (e.g., 4 GHz) or (2) half the energy difference between the two energy levels (e.g., 2 GHZ), so as to result in energy exchange between the two energy levels. However, generating such high-frequency (e.g., above 1 GHz) pulses may be experimentally difficult. This coupling scheme is commonly referred to as a parametric coupling scheme. An alternative coupling scheme may be performed by applying a lower frequency (e.g., below 1 GHZ) baseband magnetic flux pulse to slowly vary the first energy level value to be brought to an energy value that is close to the second energy level, resulting in an avoided-crossing. If the timescale of the baseband flux is much slower than the reciprocal effective coupling strength between the two energy levels, the system may not undergo substantial energy exchange. If the timescale is much faster, then the two states may be swapped (energy exchange). The lower frequency pulses (e.g., below 1 GHz) associated with this coupling scheme may be experimentally easier to generate.

Figure 2A:
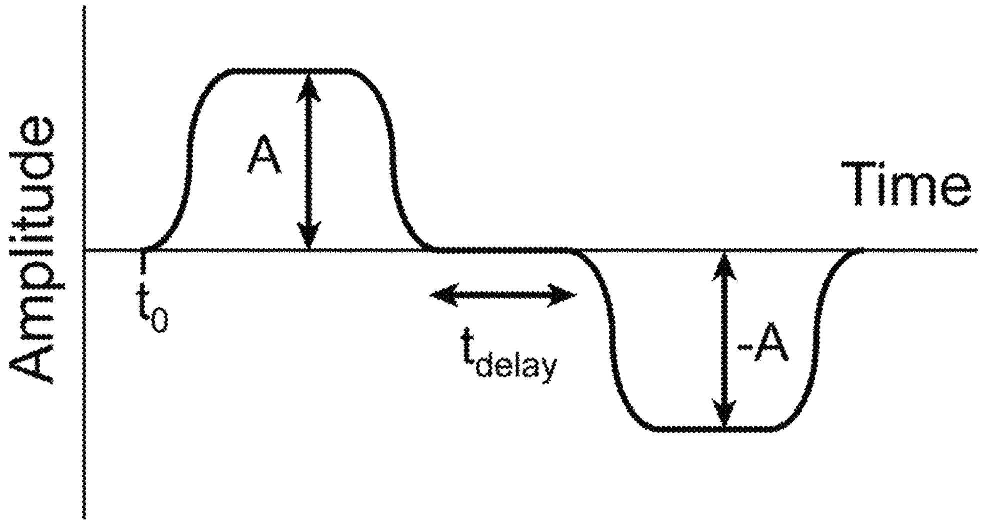
FIG. 2A is a prophetic plot of an example pulse sequence for single-qubit gates using baseband control.

FIG. 2A shows a prophetic plot of an example baseband magnetic flux pulse sequence for single-qubit gates using baseband control baseband. For example, consider a flux-tunable superconducting qubit. By applying a flux pulse that moves its flux bias away in one direction and back on a timescale comparable to or faster than the reciprocal of the qubit frequency ($f_{01}$) at the initial bias point (e.g., the idle mode), the qubit state will rotate along an axis on the XY plane. The rotation axis is determined by the timing of the pulse, specifically by adjusting the time when the pulse is applied (to). The rotation angle is controlled by adjusting the pulse's amplitude (A) and shape. In some cases, two pulses with different signs may be applied consecutively, such that the overall pulse waveform has equal positive and negative areas resulting in a net pulse area of zero. Such net-zero pulse shaping can help mitigate the effects of pulse distortion caused by various factors, including hardware imperfections. In this pulse scheme, the rotation angle and axis of single-qubit gates can also be controlled by the timing delay between the pulses ($t_{delay}$).

Figure 2B:
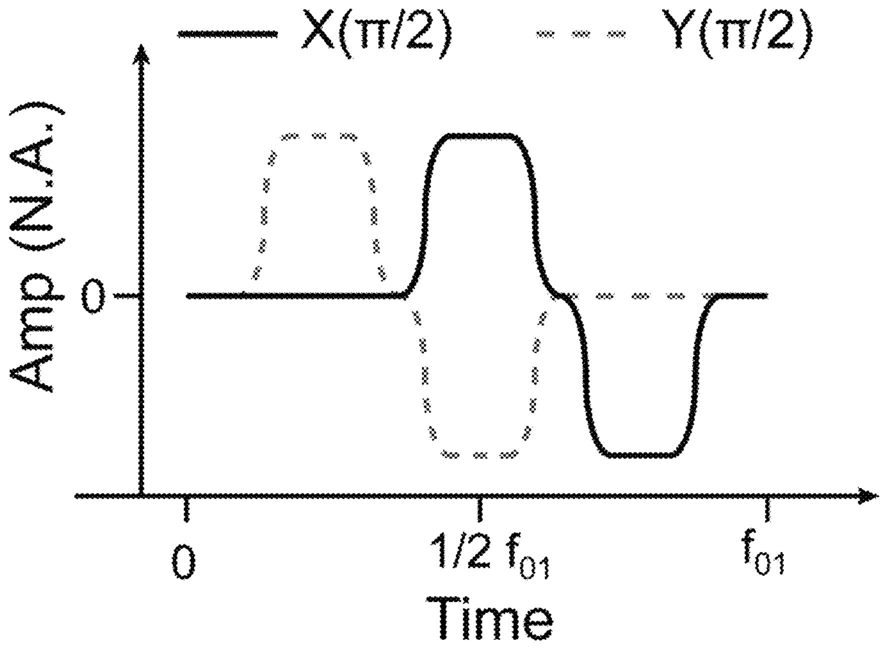
FIG. 2B is a prophetic plot of an example pulse sequence for single-qubit gates using baseband control.

FIG. 2B shows a prophetic plot of an example baseband magnetic flux pulse sequence for single-qubit gates using baseband control baseband. The single-qubit gates in this example are $X(+\pi/2)$ and $Y(+\pi/2)$ gates. In some examples, Z gates can be implemented by idling (i.e., applying no pulse) or by adiabatically sweeping the flux bias of a qubit.

In some example quantum computing systems, on-chip filters for flux lines can be used so that noise resulting from the signal lines that deliver the flux pulses to the fluxoniums can be suppressed. One way to do so is to construct an effective meta-material out of transmission lines and resonators that acts as a bandpass or bandstop filter. In other examples, a lumped LC filter that serves as a low-pass or high-pass filter may be used.

Some implementations of a quantum computing system can include the routing of wires in a multi-chip stack to form a coupled quantum element array with a high density of qubits. Other techniques may also be used for routing on-chip signal lines in a scalable fashion.

Additional sub-systems of the quantum computing system can be connected to the quantum processor and/or to one another.

Referring to FIG. 1, the control and instrumentation system 108 and the digital signal interface 106 may be responsible for signal generation and data acquisition. Operating a quantum processor (e.g., the coupled quantum element array 102) may be performed by using control electronics to generate the signals that control and probe the quantum processor comprising, for example, qubits, couplers, and resonators. The control and instrumentation system 108 may include waveform generators that have a bandwidth in the DC to 1 GHz frequency regime to provide baseband control. Such waveform generators may be used to directly drive the qubits or may be combined with high-frequency signals. The control and instrumentation system 108 may also include high-frequency sources (5-10 GHz) to generate readout signals at the resonator frequencies or pump tones for parametric amplifiers. In addition, direct current sources may be used to statically flux bias the quantum circuit elements. In order to acquire data from the quantum processor, digitizers may convert the analog readout pulses to digital data. The data may then be demodulated with FPGAs and/or in software. The control and instrumentation system 108 may include a controller box containing FPGAs that interfaces to a conventional computer to execute measurement and calibration programs and handle user inputs. Some or all of these control and instrumentation capabilities can also be implemented within the digital signal interface system 106, either in part or as a whole, to reduce overall signal latency in the system.

Referring to FIG. 1, in some examples, referred to as cold control, part or all of the control and instrumentation system 108 can be housed in a dilution refrigerator (e.g., the housing 104) and co-located with the quantum processor (e.g., the coupled quantum element array 102). For example, cold control may be implemented by superconducting digital logic circuits, a type of electronic circuitry that utilize superconducting materials to possibly enable energy-efficient and high-performance digital signal processing. Superconducting digital logic circuits process information using superconducting elements, such as Josephson junctions. Several Josephson-junction-based superconducting logic families exist, including rapid single-flux quantum (RSFQ) logic, energy-efficient RSFQ (ERSFQ) logic, energy-efficient SFQ (eSFQ) logic, dynamic SFQ (DSFQ) logic, reciprocal quantum logic (RQL), inductor-resistor RSFQ (LR-RSFQ) logic, low-voltage RSFQ (LV-RSFQ) logic, quantum flux parametron (QFP) logic, adiabatic quantum flux parametron (AQFP) logic, and nSQUID (a SQUID with negative mutual inductance) based logic. Some implementations of cold control may use superconducting digital logic circuits (e.g., adiabatic quantum flux parametrons (AQFPs)) to generate control pulses either directly on the quantum processor chip or on a chip that is located next to or above the quantum processor chip (e.g., in a bump-bonded multi-chip stack). AQFPs are a family of superconducting digital logic circuits that can have very small energy dissipation due to their adiabatic nature. Benefits of an AQFP may include its low power dissipation, classical reversibility, compatibility with low-frequency baseband control (because the pulses can be slow), and clean high-frequency spectral content (which can reduce undesirable level transitions to other quantum states, sometimes referred to as leakage). AQFP is a member of the single flux quantum (SFQ) family of superconducting device technology. In superconducting digital logic circuits, information is typically stored, processed, and transferred in the form of a single quantum of magnetic flux, also referred to as single flux quantum (SFQ), in various superconducting loops. In Rapid Single Flux Quantum (RSFQ) logic and Reciprocal Quantum Logic (RQL), which are other SFQ logic approaches related to AQFP logic, a Josephson junction is "flipped" (i.e., switched into a dissipative voltage state) during the operation. Once the junction is flipped, one does not have control over the dynamics, whereas in AQFP dynamics may be better controlled. One or more AQFP circuits can be combined into a digital-to-analog converter (DAC) that takes digital input and converts it into baseband flux pulses to control the quantum system, e.g., qubits. The pulse may be transferred to the qubit by mutually inductively coupling the AQFP and fluxonium.

Herein, "single flux quantum (SFQ) circuits" are superconducting circuits encompassing all superconducting logic families based on Josephson junctions. For example, in the case of AQFP logic, the presence of a single flux quantum within either its right or left loop corresponds to logical "0" and "1" information, respectively. Different superconducting digital logic families manipulate single flux quanta in different ways. For example, RSFQ circuits change the number of flux quanta in loops through current biasing Josephson junctions into the resistive state (also referred to as the voltage state). In contrast, QFP and AQFP circuits change the number of flux quanta in loops by quenching the effective critical current of a superconducting loop interrupted by Josephson junctions via flux biasing.

Figure 3:
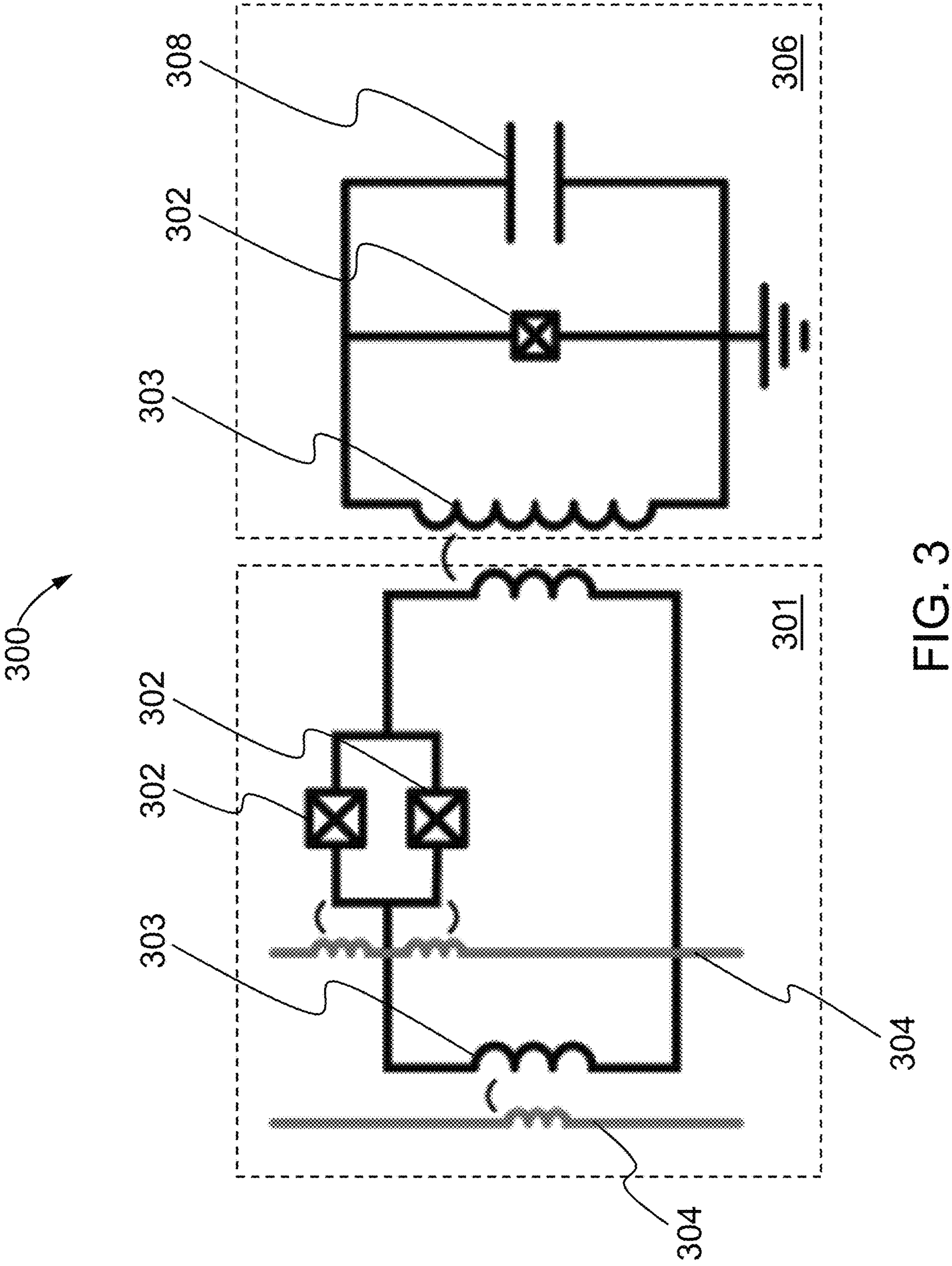
FIG. 3 is a schematic diagram of an example quantum computing circuit.

FIG. 3 shows an example circuit 300 in which an AQFP 301, comprising Josephson junctions 302 and inductive elements 303, is inductively controlled by signal lines 304 and is inductively coupled to a fluxonium qubit 306. The fluxonium qubit 306 comprises inductive element 303, Josephson junction 302, and a capacitive element 308. While this setup allows for a single bit of resolution, multiple AQFP circuits can be combined into a multi-bit DAC module capable of more than one bit of amplitude resolution.

One implementation of such a multi-bit DAC can be achieved via multiple inductive couplings to the qubit, but other implementations are also possible. A separate tunable coupler or trimming circuit can also be used to mediate the coupling between the AQFP DAC and the qubit in order to increase the effective bit resolution. Such a coupler may be statically configured. Features of the control module may include: DACs to produce balanced output, idling operation of DACs, multi-bit DACs, DAC amplitude control (e.g., tunable couplers), DAC timing control (e.g., an "annealing offset" which changes the DAC firing point and thus the timing of the leading/trailing edge of the resulting DAC pulse). In some examples, the timing control can be managed. In some cases, the system manages by trading static flux "trimming" for dynamic control, such as timing. Other single flux quantum circuit types (such as RQL or RSFQ logic) could be used instead of AQFPs for any or all of the examples above.

In some examples, the quantum processor can be operated in a dilution refrigerator at temperatures in the millikelvin regime. The cooling power of a dilution refrigerator may be limited and costly to increase/upgrade. It may therefore be desirable to limit the amount of power from electronic signals that is dissipated inside the refrigerator. Techniques described herein for implementing the hardware modules in the system (e.g., fluxonium qubits coupled via a tunable coupler, cold control with SFQ circuits) may greatly reduce the heat load on the system and thus make the quantum system more scalable to larger numbers of qubits.

Materials processing and microchip integration techniques can be used for superconducting quantum processor units (QPUs). These modules may consist of one or several chip dies, cut out of wafers typically made of silicon, that can be integrated into a single-die (single-tier) module or a multi-tier module. It is possible to transfer the device designs into superconducting metal on the wafer by using processing techniques familiar from the semiconductor industry. Techniques can include processing methods, materials choices, architectural choices, techniques for device characterization and quality control, etc.

In a first example, QPUs are passive and comprise, for example, qubits, resonators, filters, and wiring layers, which are controlled by commercially available electronics located at room temperature. The device components can be composed primarily of aluminum (although other materials can be used). The qubits' non-linear dissipation-less elements, the Josephson junctions, may consist of submicron-sized tri-layer structures made of aluminum/aluminum oxide/aluminum. The quantum circuits can be made using semiconductor processing techniques such as surface-cleaning techniques; annealing; polymer chemistry; deposition of metals by e.g., sputtering, evaporation, atomic-layer deposition, or electroplating; planarization; optical, direct-write (laser), or electron-beam lithography; lift-off, wet etching, dry etching (by reactive ions, ion beams, rf-excited plasma, etc.); various electrical, optical, chemical, and mechanical characterization methods; etc. In the case of multi-chip modules, flip-chip bonding may require special processing steps to ensure mechanical and electrical connection and inter-chip alignment. Dies larger than approximately the radio-frequency wavelengths of interest (approximately 20 mm) may benefit from special consideration to suppress these modes so they do not disturb the quantum circuits, which can be accomplished by etching through-silicon vias and metallizing the side walls, thereby connecting the ground planes on opposite sides of the chip. Such vias can also be used to transfer signals through the chip, and in more advanced architectures one can bury wires and components in several layers, thereby facilitating the routing of signals within complex circuits.

In a second example, QPUs are integrated with active circuitry (i.e., a classical co-processor) that generates the electric pulses that control and detect the states of the qubits in the QPUs. This control circuitry can include AQFP logic devices. Fabrication of small-scale devices is possible, since most of the fabrication processes described above apply here, with small additions and/or modifications. In some cases, these devices operate in the adiabatic regime; therefore, their heat dissipation will be minimal and they can be integrated close to the QPUs, perhaps even within the same module, which would facilitate implementing wiring between the control circuitry and the QPUs. AQFP operation can use tight co-location, or the AQFP co-processor can instead be located some distance away from the QPU, but still at low temperature within the cryostat. In this case, there may be more freedom in the choice of processing and integration methods.

Firmware comprising instrument control software and data analysis can be used for instrument control and data storage and manipulation. Furthermore, a calibration software suite can be implemented using firmware of an instrumentation system integrated with the quantum system. This may include a measurement setup program that can be operated to perform measurements, as well as automation capabilities for closed loop measurement-analysis-feedback cycles. An instrument server may make use of instrument drivers to establish instrument connections and distribute commands. Data visualization and analysis tools may be used to understand experimental data and inform future experiments.

Some example quantum computing systems may use agile instrument control and data handling for automated processor tune-up and benchmarking. For example, a software architecture can enable the system to define, schedule, and execute automatic qubit calibration (or "tune-up") and benchmarking protocols for quantum processors. An example feature can include high data accessibility to allow for integration of machine learning techniques in the device tune-up protocols. The system can include (1) a module for interfacing with control electronics, (2) a service for launching and handling a large number of processes for data acquisition and data analysis across multiple CPUs, (3) a service for coordinating instrumentation and analysis to execute tune-up protocols, (4) a service for scheduling tune-up and benchmarking protocols, (5) a database system capable of handling large sets of structured experimental data, and (6) a service that provides tools for data analytics and machine learning.

Figure 4:
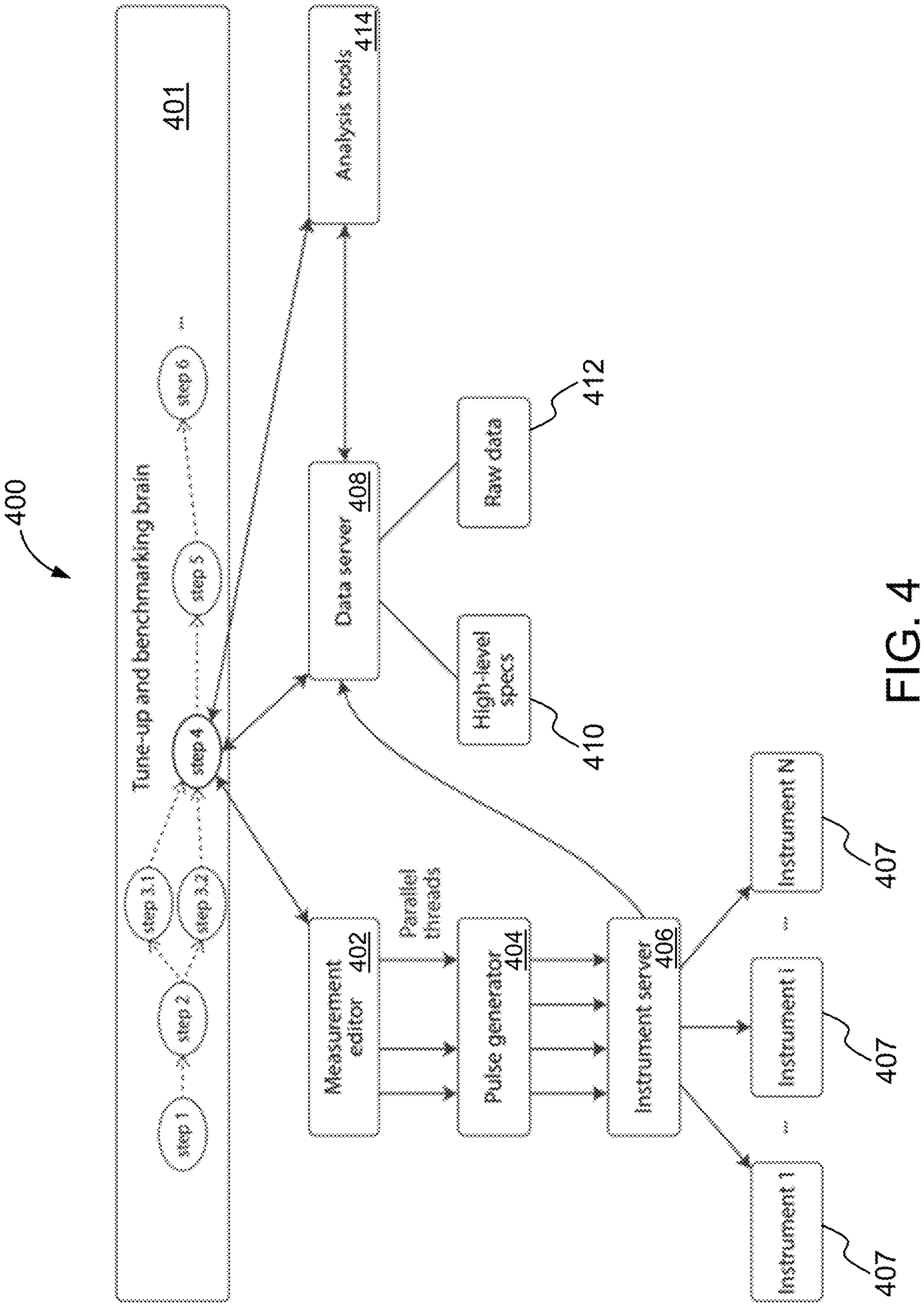
FIG. 4 is a schematic diagram of an example instrumentation system for a quantum computing system.

FIG. 4 shows an example system 400 comprising firmware infrastructure for agile instrument control and data handling, enabling automated tune-up and benchmarking. In this example, a tune-up and benchmarking manager 401 performs procedures with the use of various interacting modules. The modules can be implemented using firmware executing on computing circuitry integrated with a quantum system, or software executing on one or more processors of a separate classical computing system. Any given step of a procedure may involve one or more of the modules. For example, a measurement editor module 402 can use parallel threads to interact with a pulse generator module 404. The pulse generator module 404 can use parallel threads to interact with an instrument server module 406, which can manage a connection of N instrument procedures 407 and communicate with a data server module 408, which may access high-level specifications 410 (e.g., specifications of quantum circuits), and raw data 412. An analysis tools module 414 can also communicate with the tune-up and benchmarking manager 401 and the data server 408.

In some examples, firmware protocols can be used to control AQFP DACs to perform multiplexing, set trim SQUIDs, etc. In general, software infrastructure can be used to compile a set of gates into AQFP architecture control pulses so that timing, amplitude, and idling are properly scheduled and synchronized.

In order to scale quantum computing systems, it may be beneficial to use chip layout software for scalable quantum processor design to facilitate the processor layout generation. Python code can be used to directly generate the circuit geometry, and features such as automated design rule can perform checks and auto-routing of wires.

Some of the instrumentation, system design, or other techniques described above, can be implemented using a program comprising instructions for execution on a classical computing device or module including one or more processors or other circuitry for executing the instructions. For example, the instructions may execute procedures of software or firmware that runs on one or more programmed or programmable computing devices or modules including at least one processor and at least one data storage system (e.g., including volatile and non-volatile memory, and/or storage media). The programs may be provided on a computer-readable storage medium, readable by a general or special purpose programmable computer, and/or delivered over a communication medium such as network to a computer where it is executed. Each such program may be stored on or downloaded to a storage medium (e.g., solid state memory or media, or magnetic or optical media) readable by a computing device, for configuring and operating the device when the storage medium is read by the device to perform the procedures of the program.

In some of the example quantum computing systems disclosed herein, some of the constituent qubits can be made to interact in a pairwise fashion via a coupler circuit. The coupler circuit may be connected inductively and/or capacitively to each of the qubits and may be tunable via an external magnetic field. Such coupler circuits can be used to mediate multi-qubit gate operations with high fidelities (e.g., approaching fidelities sufficient to enable fault-tolerant quantum computation) while still being compatible with baseband control using the techniques described herein.

One example coupling scheme between qubits in a quantum element array uses a Fluxonium-Tunable Coupler-Fluxonium (FTF) arrangement, comprising two fluxonium qubits for quantum computation and a qubit possessing a resonant frequency that is tunable (e.g., RF-SQUID, DC-SQUID, charge qubit, flux qubit, phase qubit, tunable transmon, gatemon, capacitively shunted flux qubit, quarton, generalized flux qubit, fluxonium, and heavy fluxonium) coupled to the fluxonium qubits, wherein the tunable qubit serves as a coupler mediating the interaction between the coupled fluxonium qubits. The interaction strength (i.e., the effective coupling strength) between the qubits can be tuned by changing the coupler frequency.

Figure 5A:
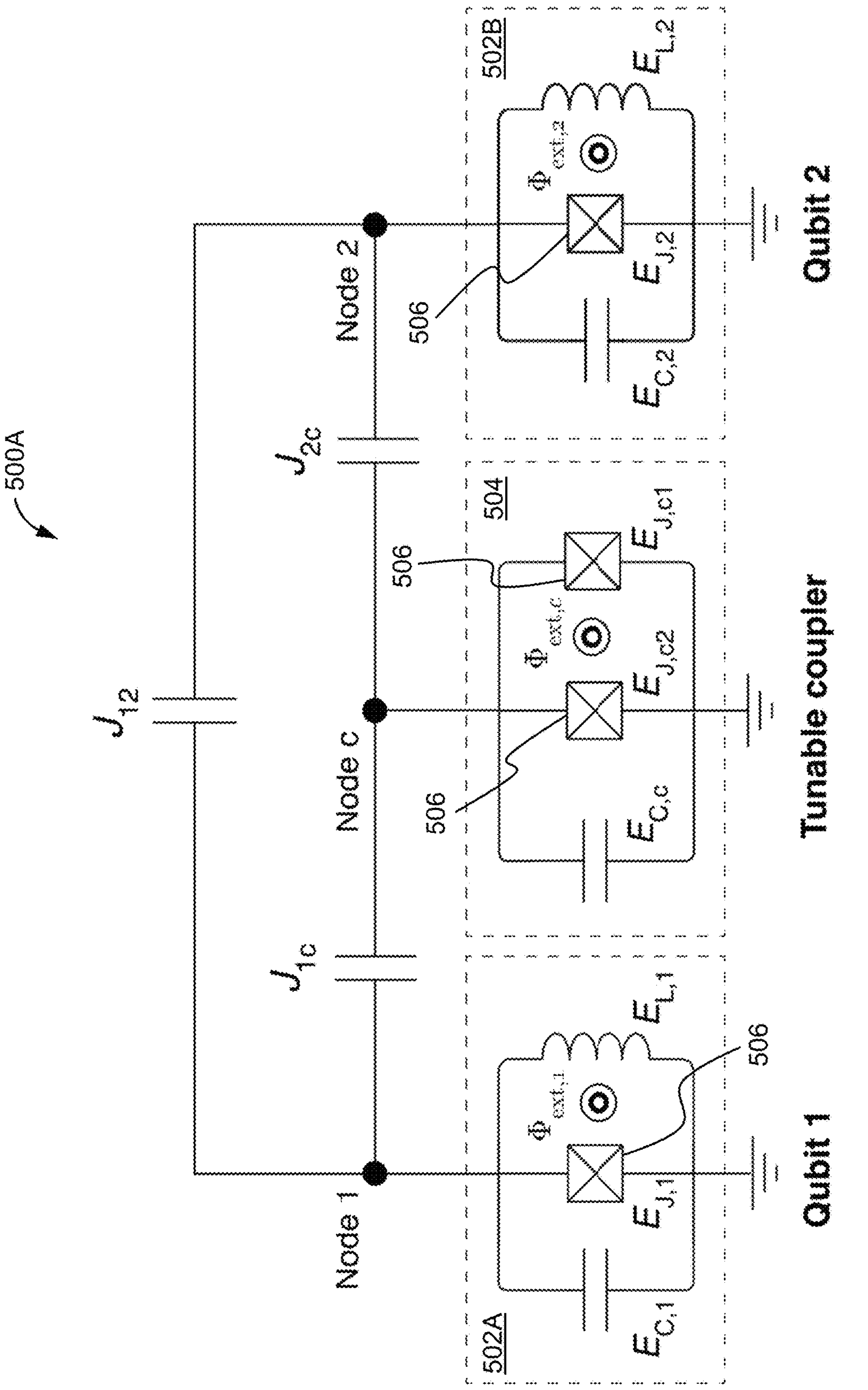
FIGS. 5A, 5B, and 5C are schematic diagrams of example quantum computing circuits.

FIG. 5A shows an example quantum computing circuit 500A in a Fluxonium-Tunable Coupler-Fluxonium arrangement. A first fluxonium qubit circuit 502A and a second fluxonium qubit circuit 502B are capacitively coupled to a capacitively shunted dc SQUID circuit 504. The capacitively shunted dc SQUID circuit 504 can act as a tunable coupler element and it could be realized, for example, as a flux-tunable transmon qubit circuit. For example, the effective coupling strength between the first fluxonium qubit 502A and the second fluxonium qubit 502B may be controlled by adjusting the external magnetic flux $\Phi_{ext,c}$ threading a superconducting loop of the capacitively shunted dc SQUID circuit 504 (e.g., a flux-tunable transmon qubit circuit). The flux may be briefly tuned to the coupling point before returning to the idle mode of the sub-circuits. The idle mode in the FTF system refers to the state when the qubits are not undergoing any two-qubit gate operations. By adjusting the rate and amplitude of the resulting magnetic flux pulse, a high-fidelity gate can be realized. The magnetic flux pulses in such a system are compatible with baseband technology. At the idle mode, the parasitic interaction (i.e., ZZ coupling) between the first fluxonium qubit 502A and the second fluxonium qubit 502B can be suppressed or completely turned off owing to the cancellation between higher-order interactions (e.g., $2^{nd}$, $3^{rd}$, and $4^{th}$ orders) between the qubits and the coupler. Josephson junctions 506 forming inductive loops can have either identical Josephson energies ($E_{J,c1}=E_{J,c2}$) or different Josephson energies ($E_{J,c1}\neq E_{J,c2}$). Various parameters of the circuit elements can be modified to achieve a desired system that is compatible with the two-qubit gate methods disclosed below.

Figure 5B:
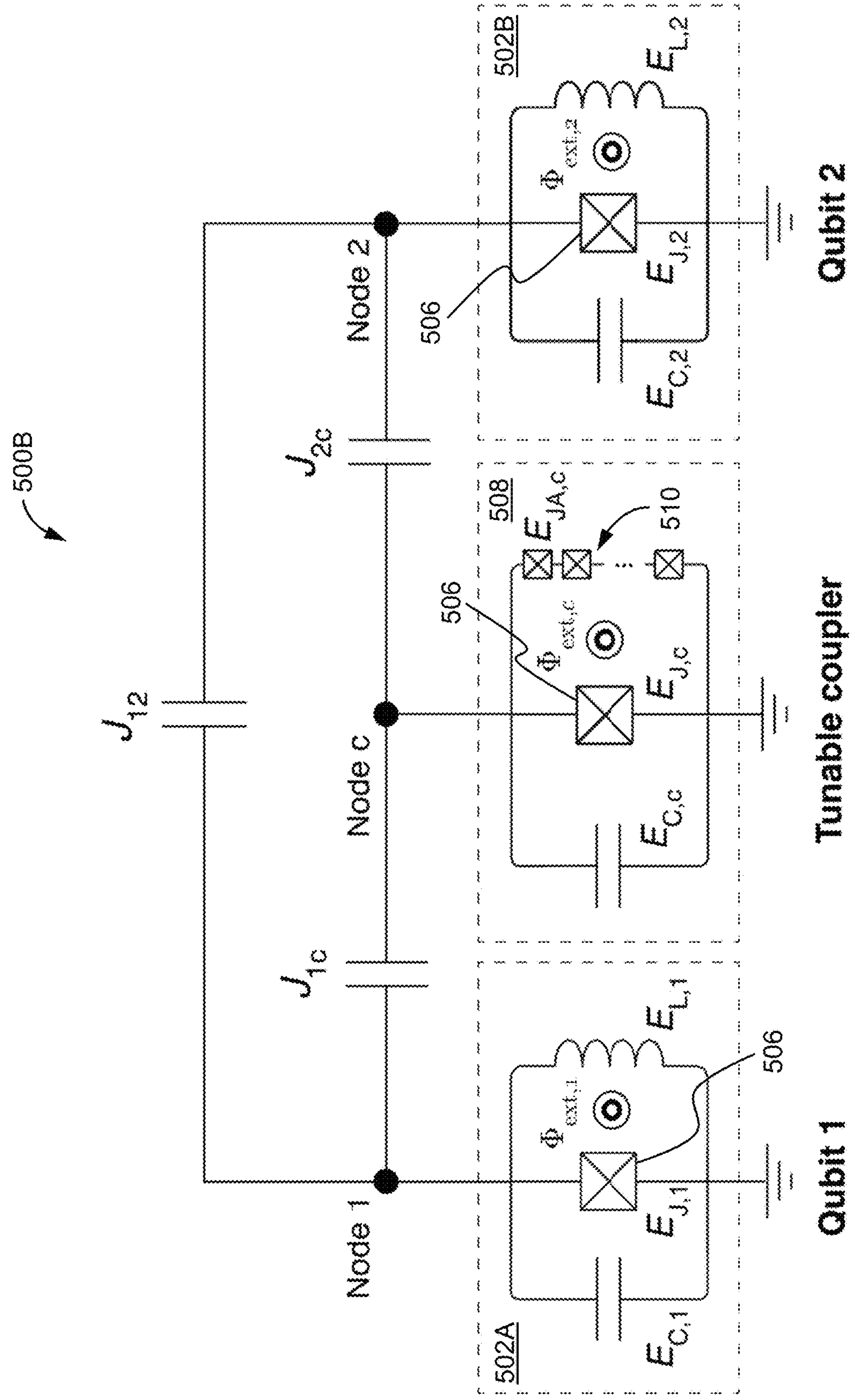

FIG. 5B shows an example quantum computing circuit 500B in a Fluxonium-Tunable Coupler-Fluxonium arrangement. A first fluxonium qubit circuit 502A and a second fluxonium qubit circuit 502B are capacitively coupled to a generalized flux qubit circuit 508. The generalized flux qubit circuit 508 can act as a tunable coupler element and comprises a Josephson junction 506 shunted by a capacitor and an array of Josephson junctions 510. The number of Josephson junctions forming the array of Josephson junctions 510 can vary from two to hundreds, for example. The effective coupling strength between the first fluxonium qubit circuit 502A and the second fluxonium qubit circuit 502B may be controlled by adjusting the external magnetic flux threading a superconducting loop of the generalized flux qubit circuit 508. A quantum gate, such as a two-qubit gate, can be performed by applying one or more flux pulses to the superconducting loop of the generalized flux qubit circuit 508 and/or the superconducting loops of the fluxonium qubits (e.g., 502A and 502B). The magnetic flux pulses in such a system are compatible with baseband technology.

Utilizing a generalized flux qubit as a tunable coupler can offer advantages in scaling up multi-fluxonium systems by alleviating design constraints. Unlike a transmon qubit, which may require a possibly large shunt capacitance, a generalized flux qubit does not require a large shunt capacitance to mitigate the dephasing effect of charge noise. This is because the shunted array of Josephson junctions in the generalized flux qubit may be configured to mitigate the impact of charge noise. Due to its smaller shunt capacitance requirement, the generalized flux qubit coupler can be strongly coupled to fluxonium qubits, enabling the implementation of fast two-qubit gates with moderate coupling capacitance, typically ranging from 1 fF to 10 fF. Implementing this range of coupling capacitance in multi-fluxonium architectures is practically feasible and does not significantly limit the choice of fluxonium design and parameters, thus facilitating scalability.

Figure 5C:
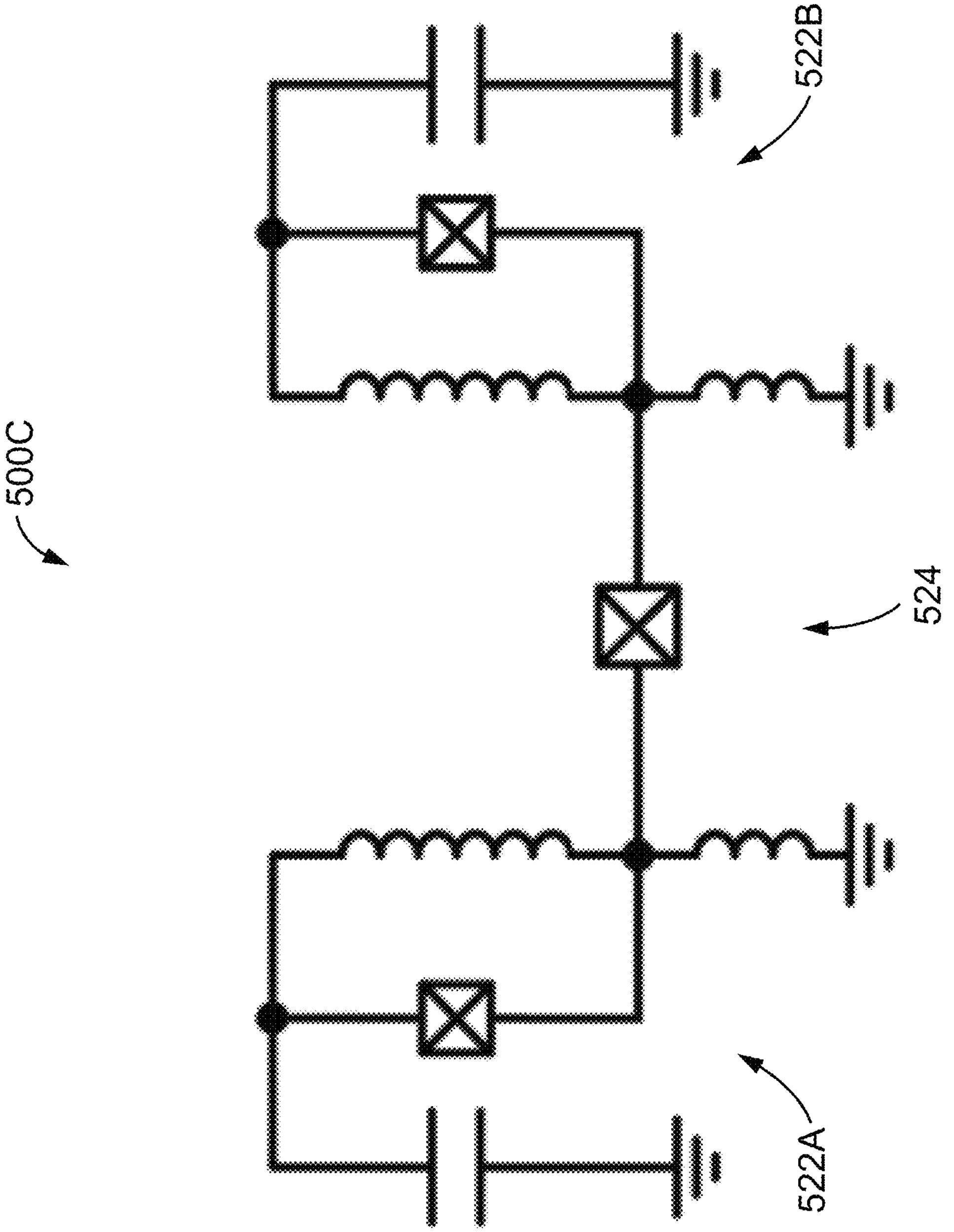

FIG. 5C shows an example superconducting circuit 500C comprising a first fluxonium qubit 522A and a second fluxonium qubit 522B inductively coupled via a tunable inductive coupler 524 (e.g., an RF-SQUID). The first fluxonium qubit 522A and the second fluxonium qubit 522B are directly (galvanically) connected to the tunable inductive coupler 524, which contains inductive elements both between the two fluxonium coupling points and to ground. A quantum gate can be performed by applying one or more flux pulses to the inductive loop of the tunable coupler 524 and/or the superconducting loops of the fluxonium qubits (e.g., 522A and 522B). Again, the magnetic flux pulses in such a system are compatible with baseband technology.

FIGS. 5D and 5F show example design parameters of the capacitively coupled FTF system (e.g., FIG. 5A). $E_J$, $E_C$, and $E_L$ denote Josephson energy, capacitive energy, and inductive energy of circuit elements, respectively. $J_{12}$ is the capacitive coupling energy between the fluxonium qubits, $J_{1c}$ ($J_{2c}$) is the capacitive coupling energy between the coupler and fluxonium qubit 1 (qubit 2). The Hamiltonian of such an FTF system may be written as $$H/h=\sum_i 4E_{C,i}\hat{N}_i^2+\frac{1}{2}E_{L,i}\hat{\phi}_i^2-E_{J,i}\cos\left(\hat{\phi}_i-\frac{2\pi}{\Phi_0}\Phi_{ext,i}\right)+4E_{C,c}\hat{N}_c^2-$$
$$E_{J,c1}\cos(\hat{\phi}_c)-E_{J,c2}\cos\left(\hat{\phi}_c-\frac{2\pi}{\Phi_0}\Phi_{ext,c}\right)+J_{1c}\hat{N}_1\hat{N}_c+J_{2c}\hat{N}_2\hat{N}_c+J_{12}\hat{N}_1\hat{N}_2$$

where h is the Planck constant, the index i sums over qubit 1 and qubit 2, $\hat{N}$ is the node charge operator, $\hat{\phi}$ is the node phase operator, and subscripts 1, 2, and c correspond to the qubit 1, qubit 2, and coupler node, respectively. During the gate operation, the effective coupling strength through the coupler can vary. Herein, a state of the FTF system is represented as |QB1 QB2 CPLR>, where QB1, QB2, and CPLR are the states of qubit 1, qubit 2, and the tunable coupler, respectively. In some examples, device parameters may be chosen such that the effective coupling strength between the |110> and |020> states (i.e., the energy gap between |110> and |020> at their avoided crossing) varies from 0 MHz to 45 MHz throughout the operation.

The idle mode in the FTF system refers to the state when the qubits are not undergoing any two-qubit gate operations. During this mode, the flux biases of fluxonium qubits may be set to half-integer magnetic flux quantum values, specifically $$\Phi_{ext} = \left(\frac{2n+1}{2}\right)\Phi_0,$$

is an integer and $$\Phi_0 = \frac{h}{2e},$$

where h is Planck's constant and e is the charge of an electron. This choice of flux bias allows the fluxonium qubit to exhibit long coherence times due to its energy being insensitive (in first-order) to external magnetic flux. Additionally, during the idle mode, the tunable coupler that mediates the interactions between the qubits may be biased to the point where the net coupling between the qubits is suppressed or turned off, allowing for isolation between the qubits.

Superconducting qubits may have a fixed position during the fabrication process, unlike movable qubits such as ion qubits in a surface trap. As a result, qubits in close proximity may experience always-on coupling due to stray capacitance or mutual inductance between neighboring circuit elements. This static coupling can lead to unwanted two-qubit entanglement between qubits, such as parasitic ZZ coupling. Unwanted ZZ coupling induces coherent errors in the system and poses a significant obstacle in scaling up qubit systems, as the errors become more complicated and intractable with an increasing number of qubits. The suppression of the qubit-qubit coupling during the idle mode may be important for minimizing such unwanted interactions between qubits. Moreover, having the ability to turn off the coupling between qubits provides greater flexibility in terms of changing the frequency of a qubit. For example, when the frequency of one qubit collides with that of another qubit, leakage from one qubit to the other can be suppressed by turning off the coupling. Leakage refers to an undesired transfer of an energy excitation from one qubit to the other qubit, e.g., from |10> to |01>, due to the coupling between them. In general, the leakage dynamics may be explained by the Landau-Zener effect. In multi-qubit systems, where frequency collisions are more likely to occur, the capability to prevent energy leakage can be particularly useful.

Some of the methods disclosed herein enable the implementation of multiple types of two-qubit gates, such as the CPhase (controlled-phase), CZ (i.e., controlled-Z), CNOT, iSWAP-like, and FSim gates. For example, a controlled-Z gate applies the Pauli-Z (Z) operator to a target qubit if a control qubit is in the state |1>, and does nothing otherwise. If the control qubit is in a superposition state, then the portion of the superposition state in the state |1> will result in a Pauli-Z operator being applied to the corresponding portion of the target qubit that forms a tensor product with the state | 1> in the superposition. The portion of the target qubit that forms a tensor product with the portion of the superposition state in the state |0> of the control qubit will have no Pauli-Z operator applied.

The CPhase gate, short for the controlled-phase gate, is a type of two-qubit gate that applies a phase shift on the state of one of the qubits depending on the state of the other qubit. This conditional phase shift can be implemented using the interaction between the two-qubit state |11> and a non-computational state, such as |20> or |02>. Non-computational states are quantum states that are not intended to store long-term quantum information, but may be used during the execution of one or more quantum gates. The controlled-Z gate, also known as the CZ gate, is a specific type of the CPhase gate that applies a conditional phase shift of 180 degrees.

The CNOT gate, short for the controlled-not gate, is a two-qubit gate that applies an X gate on one of the qubits (the target qubit) depending on the state of the other qubit (the control qubit). In some examples, the CNOT gate can be implemented by combining the CZ gate with Hadamard gates: a type of single-qubit gate. For example, a CNOT gate may be applied between a control qubit and a target qubit by applying a Hadamard gate to the target qubit, applying a CZ gate (where either the control qubit or the target qubit may act as the CZ control qubit), and applying another Hadamard gate to the target qubit.

The iSWAP gate is a two-qubit quantum gate that swaps the states of two qubits, |10> and |01>, with a phase factor of i. iSWAP-like gates refer to a set of quantum gates that are derived from the iSWAP gate. These gates share some common properties with the iSWAP gate, but instead may perform partial swaps of the qubit states. One example of an iSWAP-like gate is the sqrt(iSWAP) gate, which performs a partial swap of the quantum states between the two qubits.

The FSim gate, short for the Fermionic Simulation gate, is a type of two-qubit gate that can be implemented by combining CPhase, iSWAP-like gates, and single-qubit gate operations.

Figure 6A:
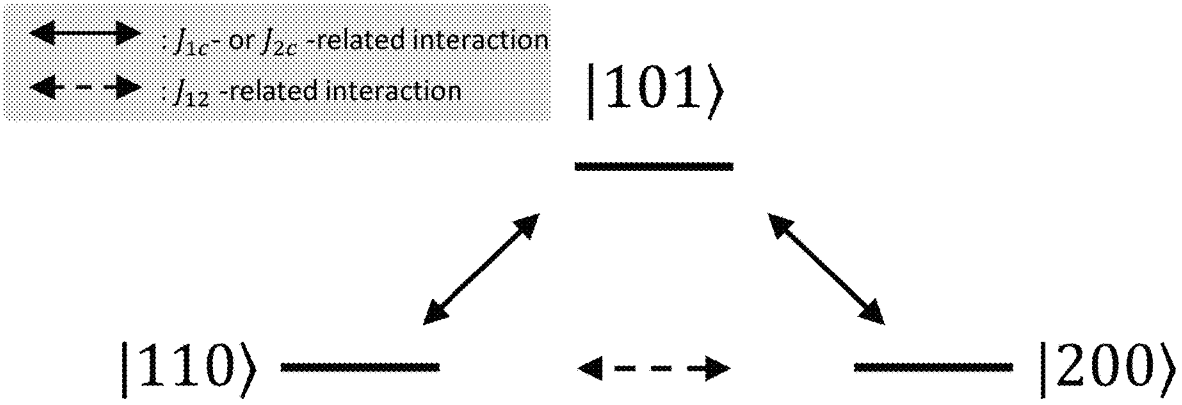
FIGS. 6A, 6B, and 6C are prophetic plots of energy levels associated with two-qubit gates.
Figure 6B:
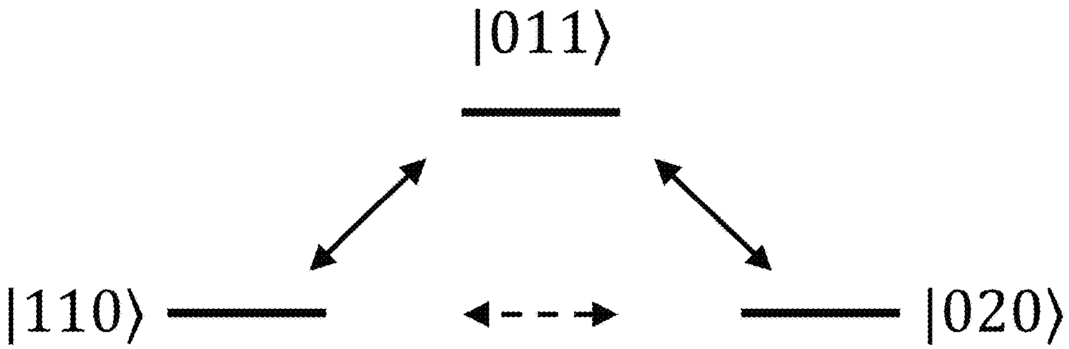
Figure 6C:
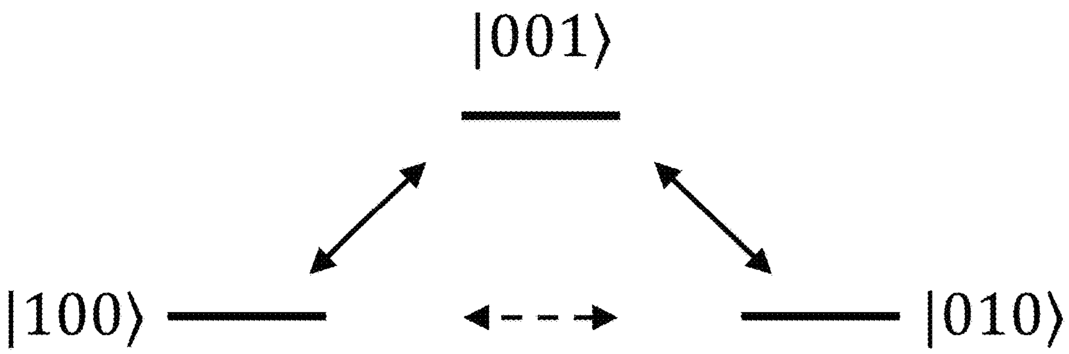

Example energy levels that are relevant for implementing two-qubit gates in the FTF system are shown in FIGS. 6A, 6B, and 6C. In FIG. 6A, the interaction between the |110> state and the |200> state comprising the non-computational doubly-excited state of a fluxonium qubit is relevant for an example implementation of the CPhase gate. In FIG. 6B, the interaction between the |110> state and the |020> state comprising the non-computational doubly-excited state of a fluxonium qubit is relevant for an example implementation of the CPhase gate. In FIG. 6C, the interaction between the |100> state and the |010> state is relevant for an example implementation of the iSWAP-like gate. Herein, we refer to the two states that are relevant for an implementation of a two-qubit gate as the gate-relevant states. The gate-relevant states interact through two types of coupling: direct exchange coupling, for example resulting from direct qubit-qubit capacitive coupling, and virtual exchange coupling, also known as indirect exchange coupling, through the intermediate coupler state (e.g., |101> in FIGS. 6A and 6B and |001> in FIG. 6C). Specifically, the direct coupling is related to the $J_{12}$ term and the indirect coupling is related to the $J_{1c}$ and $J/_{2c}$ terms in in the FTF system Hamiltonian. In FIGS. 6A, 6B, and 6C, direct couplings are represented by dashed double-sided arrows and indirect couplings are represented by solid double-sided arrows. In some examples, the FTF system may perform quantum gates between three or more fluxonium qubits (e.g., arranged as fluxonium-tunable coupler-fluxonium-tunable coupler-fluxonium (FTFTF)). For example, a fluxonium qubit can be used as a control qubit for a two-qubit gate between two other fluxonium qubits.

Referring again to FIGS. 6A, 6B, and 6C, the net exchange coupling between the gate-relevant states can be switched on and off by using the destructive interference between the direct and indirect coupling. The destructive interference between the direct and indirect coupling can be achieved by making their signs opposite to each other. In some examples, the sign of the indirect coupling is determined by the sign of the frequency difference between the qubit states (e.g., |110> and |200> in FIG. 6A) and the coupler state (e.g., |101> in FIG. 6A). Specifically, a negative (positive) frequency difference can be achieved by biasing the coupler-excited state (e.g., |101> in FIG. 6A) higher (lower) than the qubit states (e.g., |110> and |200> in FIG. 6A) which results in a negative (positive) indirect coupling. Additionally, floating qubits or couplers can be used to alter the sign of the coupling, where each qubit/coupler capacitor consists of two superconducting pads galvanically isolated from ground.

Referring again to FIGS. 6A, 6B, and 6C, in some examples the magnitude of the indirect coupling can be adjusted by tuning the frequency of the coupler state through magnetic flux adjustment. Therefore, to switch off the net coupling, the magnitude of the indirect coupling can be adjusted to be equal or near to that of the direct coupling, while setting their signs opposite. To switch on the coupling, the magnitude of the indirect coupling can be increased so that it dominates the direct coupling, resulting in a strong net coupling.

Referring again to FIGS. 6A, 6B, and 6C, in some examples two-qubit gates are implemented by applying flux pulses to the qubits and couplers. For example, the CPhase gate may operate by bringing the |110> state on or near resonance with the non-computational state |200> (or |020>). When they are resonant or near-resonant, the |110> state oscillates with the non-computational state and picks up some phase shift after a full period of the oscillation. The amount of this phase shift corresponds to the conditional phase shift of the CPhase gate. The iSWAP-like gate may operate by bringing the |100> state and the |010> state in or near resonance. When they are on resonant or near-resonant, the two states oscillate, and by letting them complete a certain period of an oscillation, the two states can be fully or partially swapped.

In some implementations, the flux pulses applied to the qubits and the coupler for an implementation of a two-qubit gate can be shaped to suppress non-adiabatic level transitions in the system. Specifically, the flux pulse for qubit 1 can be shaped to suppress the non-adiabatic transition between |000> and | 100> or between |010> and |110> or between |100> and |200> or between |110> and |210>. The flux pulse for qubit 2 can be shaped to suppress the non-adiabatic transition between |000> and |010> or between |100> and |110> or between |010> and |020> or between |110> and | 120>. The flux pulse for the coupler can be shaped to suppress the non-adiabatic transition from any computational states (|000>, |010>, |100>, and |110>) to coupler excited states (|abc>, where c>0). Non-adiabatic level transition dynamics can be explained by the physics of Landau-Zener transitions.

Figure 7:
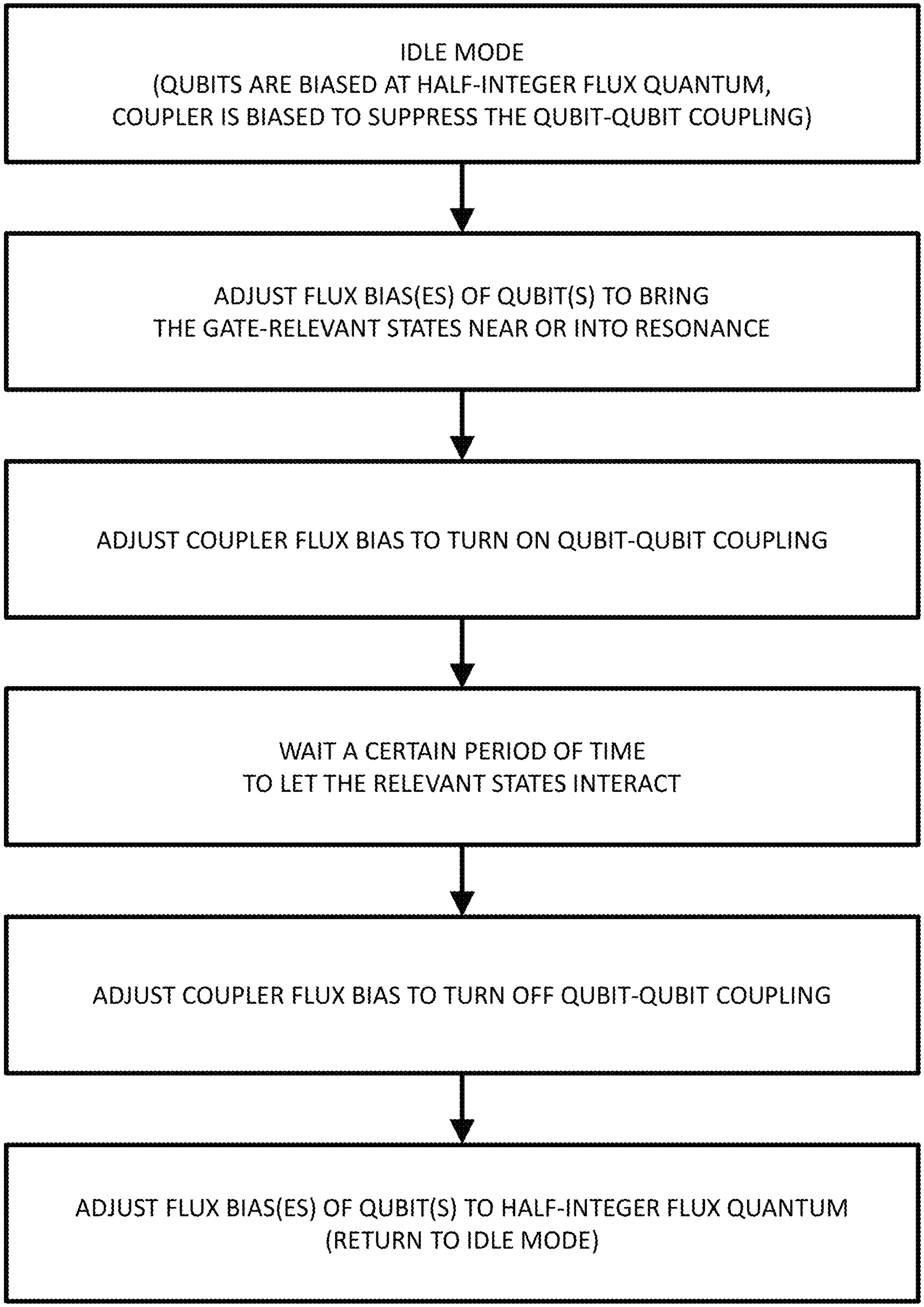
FIG. 7 is a flowchart showing a sequence of steps associated with implementing a two-qubit gate in an example quantum computing system.

FIG. 7 depicts a flowchart outlining the steps for implementing an example two-qubit gate in an FTF system, starting from an idle mode. First, an externally applied magnetic field is used to adjust the flux bias of one or more qubits so that the relevant states (e.g., |110> and |020> for the CPhase gate) for the gate operation are brought into resonance or close to it. Next, qubit-qubit coupling is turned on (i.e., increased from a lower effective coupling strength) by adjusting the coupler flux bias, and the relevant states interact for a specified period of time. Then, the qubit coupling is turned off (i.e., decreased to a lower effective coupling strength) by adjusting the coupler flux bias. Finally, the flux bias of one or more qubits is adjusted to a half-integer flux quantum (i.e., the idle mode). A person having ordinary skill in the art, using the disclosures provided herein, will understand that various steps of the method described herein can be rearranged, performed simultaneously, adapted, expanded, omitted, include steps not illustrated, and/or modified in various ways without deviating from the scope of the present disclosure.

During a two-qubit gate process, flux pulses applied to the system may result in unwanted single-qubit operations, such as X, Y, or Z rotations, or a combination of these. Undesired operations can be reversed by applying single-qubit gates before, during, or after the two-qubit gate process. Alternatively, these same undesired single-qubit operations can be utilized to implement a different type of two-qubit gate. For instance, by combining the undesired operations from the CZ gate and extra single-qubit gates before, during, or after the two-qubit gate process, the CNOT gate can be implemented.

Figure 8A:
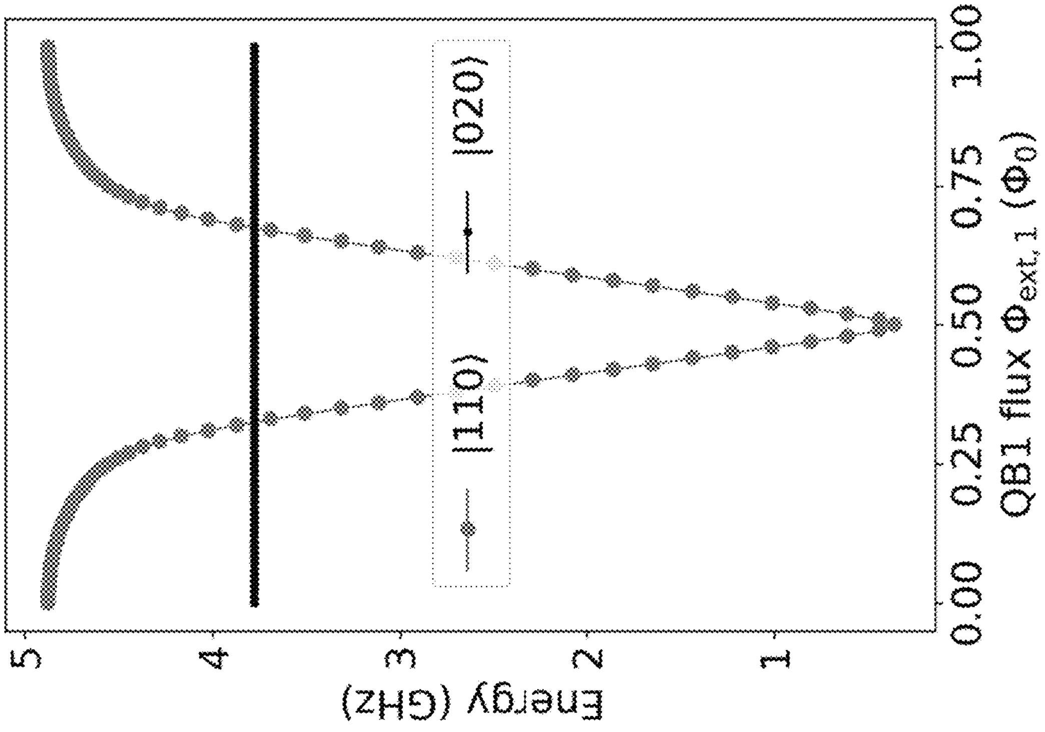
FIGS. 8A, 8B, and 8C are a set of schematic diagrams of energy spectra associated with an example quantum computing system.
Figure 8B:
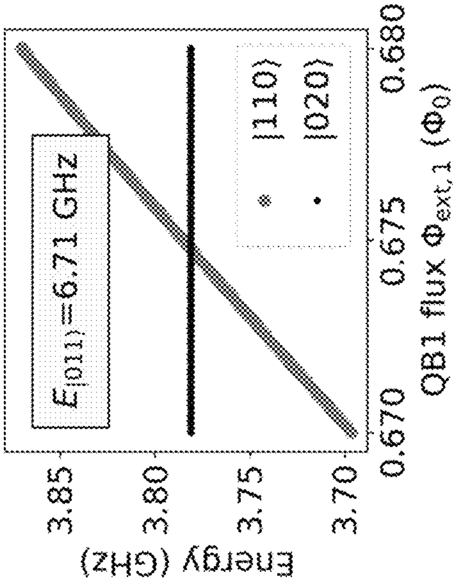
Figure 8C:
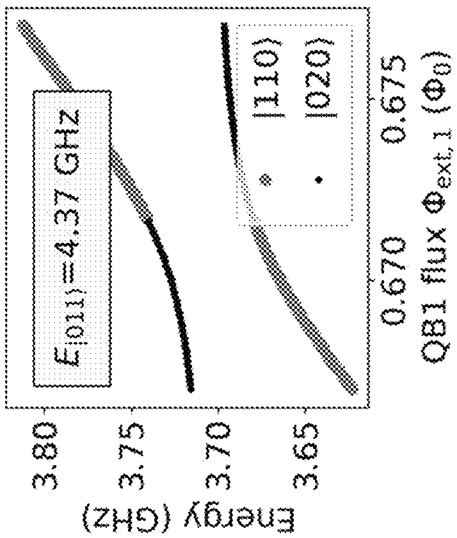

FIGS. 8A, 8B, and 8C show prophetic plots of energy spectra (in units of frequency) associated with an example quantum computing system, as a function of the flux bias of qubit 1 (QB1). FIGS. 8B and 8C show the level crossing between the states |110> and |020> when the coupling is turned off and on, respectively. In FIG. 8B, the lack of coupling between the quantum states results in the energy levels directly crossing one another. In FIG. 8C, the coupling between the quantum states results in an avoided-crossing that admixes the two states near the crossing point. These figures are based on simulations using the design parameters specified in FIGS. 5D and 5F.

The robustness of the system against flux noise near the |110>-|200> crossing point can be enhanced by engineering the design parameters of fluxonium qubits, such as Josephson energies ($E_J$), capacitive energies ($E_C$), and inductive energies ($E_L$).

Figure 9B:
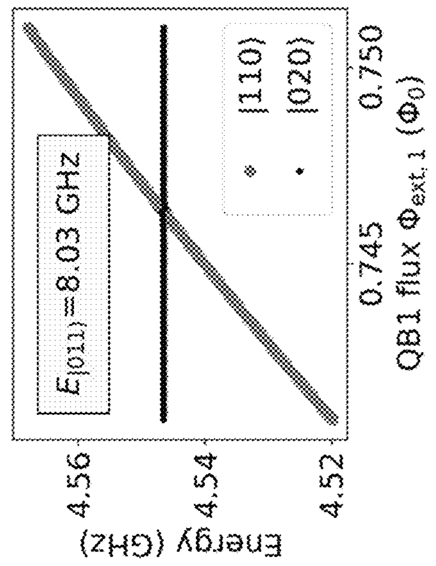
FIGS. 9A, 9B, and 9C are a set of schematic diagrams of energy spectra associated with an example quantum computing system.
Figure 9C:
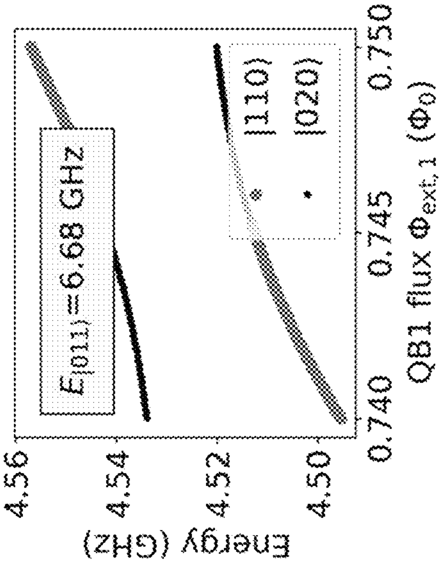
Figure 9A:
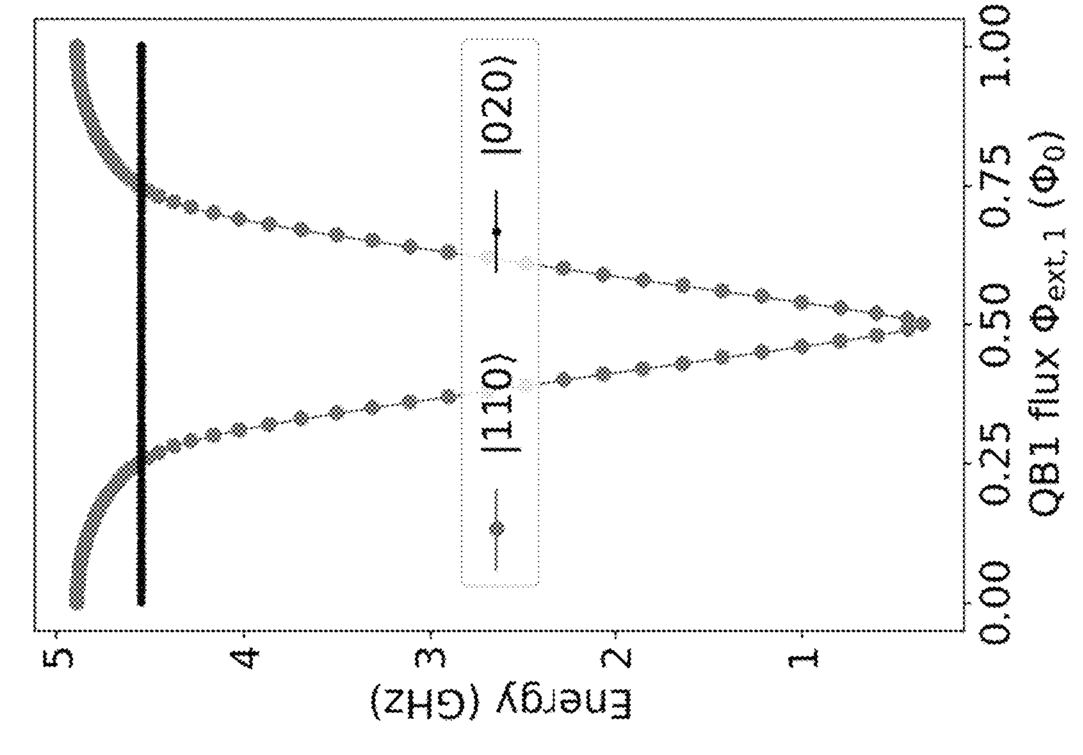

FIGS. 9A, 9B, and 9C show prophetic simulated energy spectra of an example quantum computing system based on the design parameters specified in FIGS. 5E and 5F. Note that, in comparison to the design parameters specified in FIG. 5D, the design parameters specified in FIG. 5E have higher Josephson energy and inductive energy of qubit 2 (QB2). This parameter adjustment results in an elevation of the energy value of state |020> from approximately 3.8 GHz to 4.55 GHZ (e.g., see FIG. 8A and FIG. 9A), leading to a reduction in the flux sensitivity of QB1 frequency (i.e., the flux derivative of the energy value of |100>) near the crossing point from 17.5 GHZ/$\Phi_0$ to 4.8 GHz/$\Phi_0$. This reduction in flux sensitivity may enhance the performance of two-qubit gates by mitigating the impact of flux noise during their execution. In some examples, the flux sensitivity of fluxonium qubits near the crossing point can be adjusted within a range of 0.1 GHz/$\Phi_0$ to 30 GHz/$\Phi_0$ using this approach.

Figure 10:
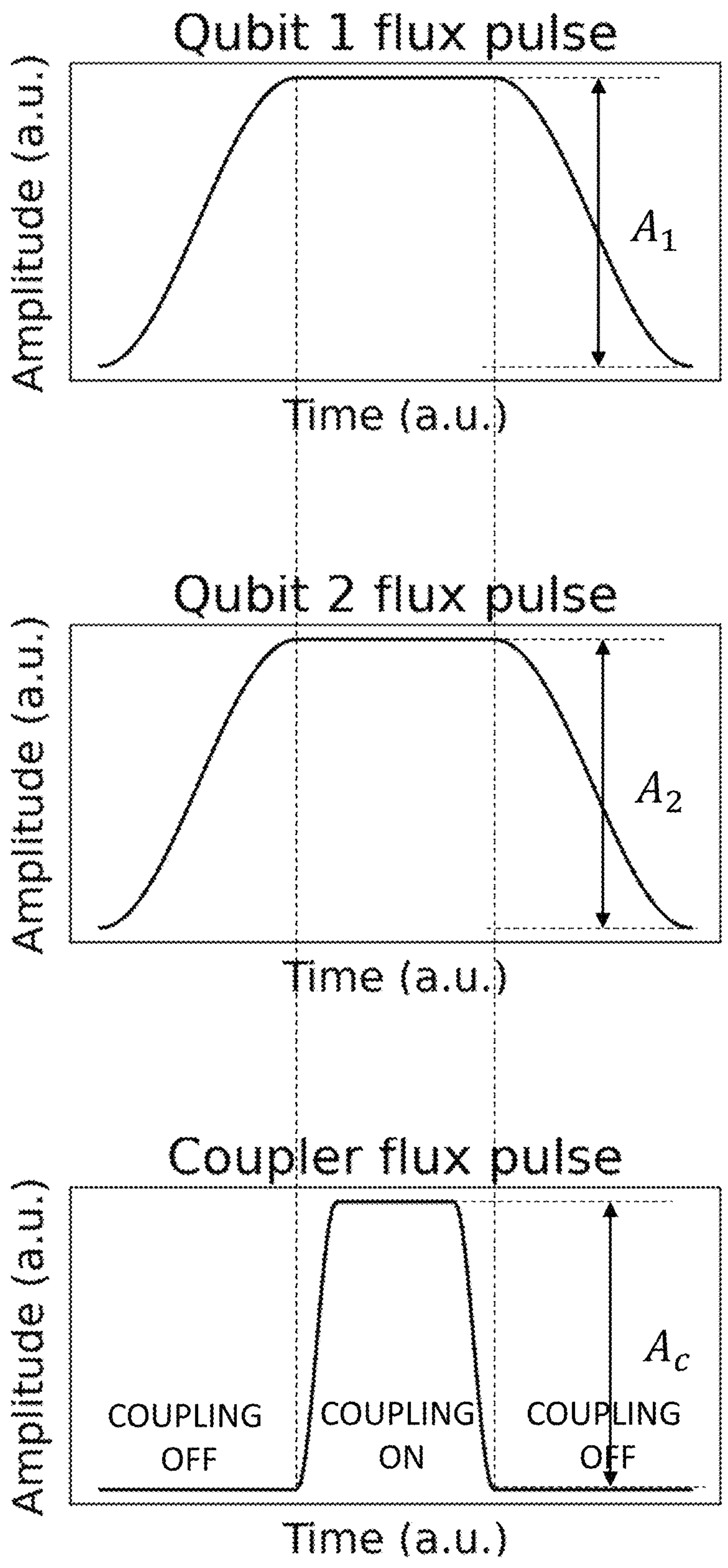
FIG. 10 is a schematic diagram of a two-qubit gate pulse sequence in an example quantum computing system.

FIG. 10 shows an example two-qubit gate pulse sequence implementing a CPhase gate in the FTF system. The flux pulses applied to qubit 1 and qubit 2 are responsible for bringing the three-qubit state |110> near or into the resonance with the non-computational state |020>, and subsequently out of resonance. The flux pulse applied to the coupler controls the effective coupling strength between the states |110> and |020> by adjusting the frequency of the coupler excited state |011>.

In some implementations, control pulses applied to qubits or/and couplers can be smoothly shaped with the goal of suppressing non-adiabatic gate errors. One possible technique for achieving this is through the utilization of fast adiabatic pulse shaping. Furthermore, control pulses applied to qubits or/and couplers can be shaped to be symmetric, with equal positive and negative areas resulting in a net pulse area of zero. This net-zero pulse shaping can help suppress the effects of pulse distortion that come from various factors, including hardware imperfections.

Figure 11A:
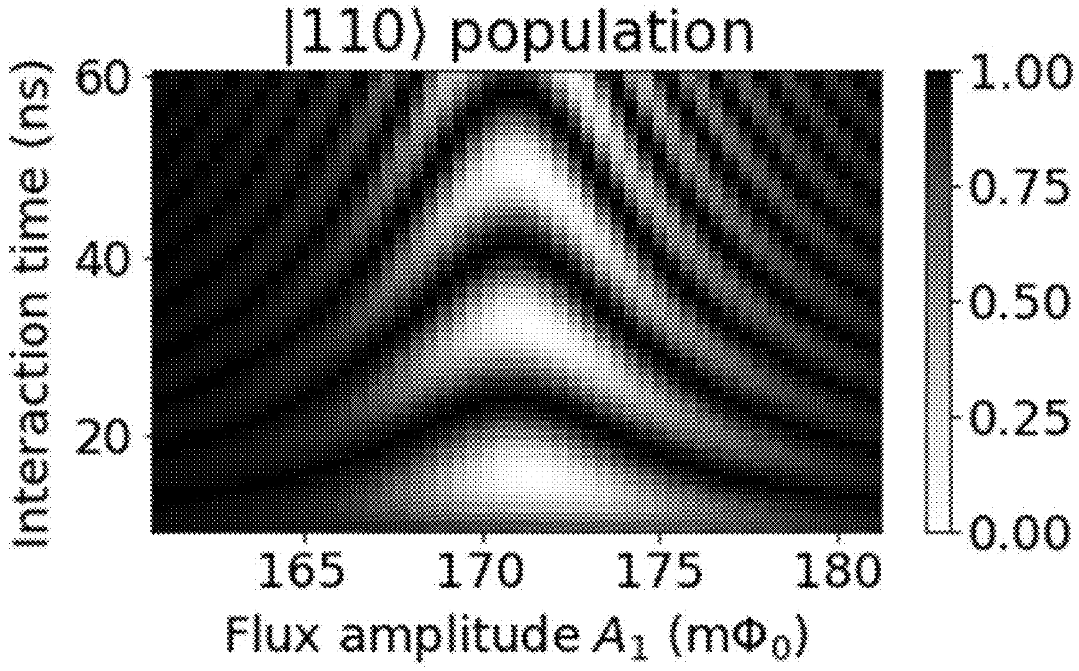
FIGS. 11A and 11B are prophetic plots showing energy exchange between the gate-relevant states under an example two-qubit gate pulse sequence.
Figure 11B:
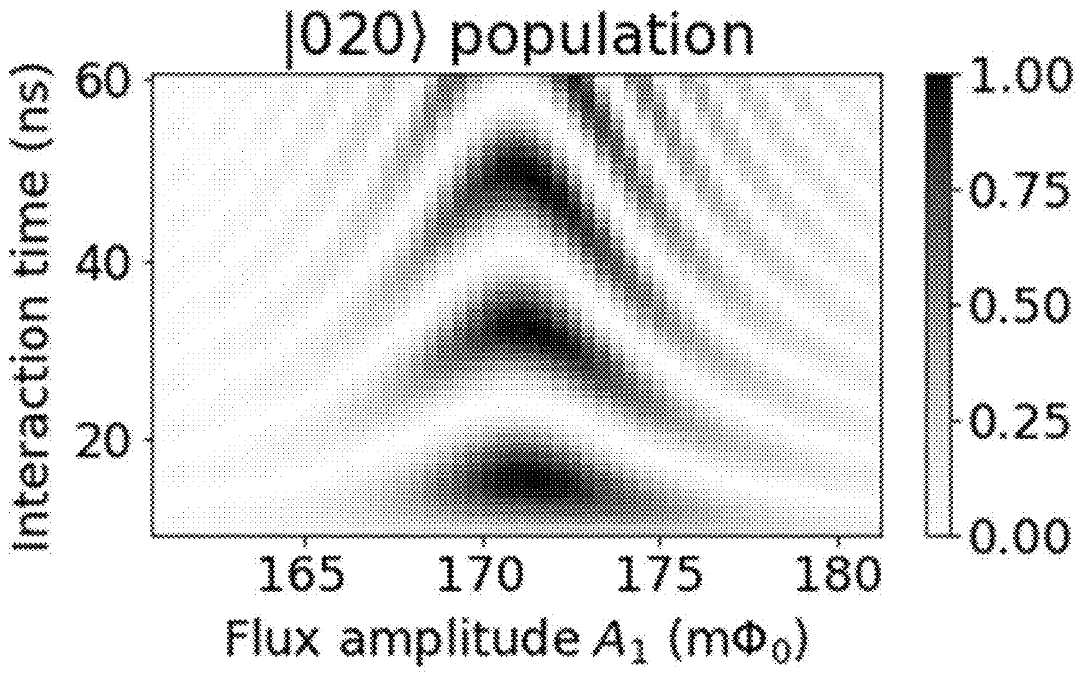

FIGS. 11A and 11B show a prophetic example of the energy exchange between gate-relevant states, |110> and |020>, when applying a two-qubit gate pulse sequence. These figures are based on numerical simulations using the design parameters specified in FIGS. 5D and 5F. The amplitude of the qubit 1 flux pulse, $A_1$ (horizontal axes), is varied while the amplitude of the qubit 2 flux pulse, $A_2$, is kept at zero. A sufficiently high coupler pulse amplitude of $A_c=0.15\ \Phi_0$ is used to activate the two-qubit interaction. The rise and fall time of the qubit 1 flux pulse is set to be 25 ns, respectively. The rise and fall time of the coupler flux pulse is set to be 5 ns, respectively. During the idle mode, the qubits are flux biased at a half magnetic flux quantum ($\Phi_{ext,1}=\Phi_{ext,2}=0.5\Phi_0$) and the coupler is flux biased at $\Phi_{ext,c}=0.243\ \Phi_0$. The interaction time, associated with the plateaus of the coupler flux pulse and the qubit 1 flux pulse, is also varied (vertical axes). The chevron patterns in FIGS. 11A and 11B show that the example two-qubit gate pulse sequence shown in FIG. 10 can be utilized to achieve well-controlled two-qubit gate interaction.

Figure 12A:
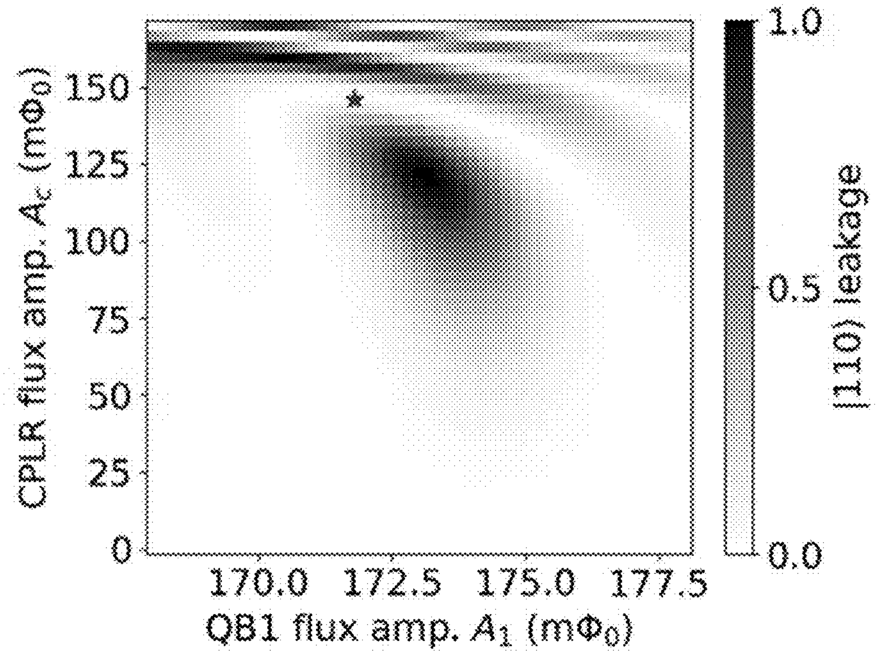
FIGS. 12A and 12B are prophetic plots showing leakage and conditional phase angle associated with an example quantum computing system under an example two-qubit gate pulse sequence.
Figure 12B:
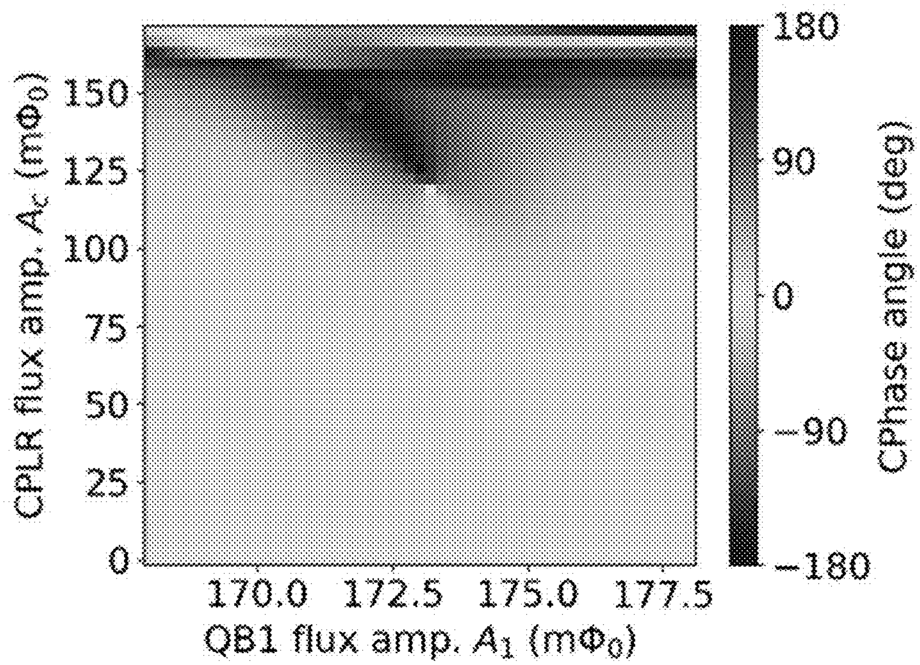

FIGS. 12A and 12B show a prophetic example of the conditional phase angle accumulated in one qubit depending on the state of the other qubit (FIG. 12B) and leakage of the state |11> (FIG. 12A), when a CPhase pulse sequence is applied. FIGS. 12A and 12B are based on numerical simulations using the design parameters specified in FIGS. 5D and 5E. The amplitude of the qubit 1 flux pulse, $A_1$ (horizontal axes), and the amplitude of the coupler flux pulse, $A_c$ (vertical axes), are varied while the amplitude of the qubit 2 flux pulse, $A_2$, is kept at zero. The rise and fall time of the qubit 1 flux pulse is set to be 25 ns, respectively. The rise and fall time of the coupler flux pulse is set to be 5 ns, respectively. The conditional phase angle of the CZ gate can be quantified by comparing the phase rotation of QB2 when QB1 is in the singly-excited state versus when it is in the ground state. The leakage can be quantified by measuring the reduction in the population of the |11> state after applying a CPhase gate.

Referring again to FIGS. 12A and 12B, the star marker represents the set of pulse amplitudes $A_1$ and $A_c$ that minimizes leakage and induces a conditional phase accumulation of 180 degrees, thereby enabling the CZ gate. By scanning leakage and conditional phase accumulation in a 2D manner against pulse amplitudes, the CZ gate can be calibrated. More generally, CPhase gates with arbitrary conditional phase angles can be implemented by selecting amplitude parameters lying within the region where leakage is minimized, represented by a donut-like contour, and the CPhase angle is aligns with the desired target angle. To fine-tune the amplitudes, leakage and/or the CPhase angle of multiple CPhase pulses can be measured to amplify the effects of small amplitude errors. Extra single-qubit gates can be applied before, during, or after the CPhase gate to compensate for accompanying single-qubit operations. In some examples, numerical optimization methods (e.g., the Nelder-Mead method) can be used to efficiently explore the parameter space by defining a cost function relevant to the gate error rate.

In general, the two-qubit gate method and the FTF system architecture disclosed herein can be extended to a system with a larger number of qubits.

Figure 13:
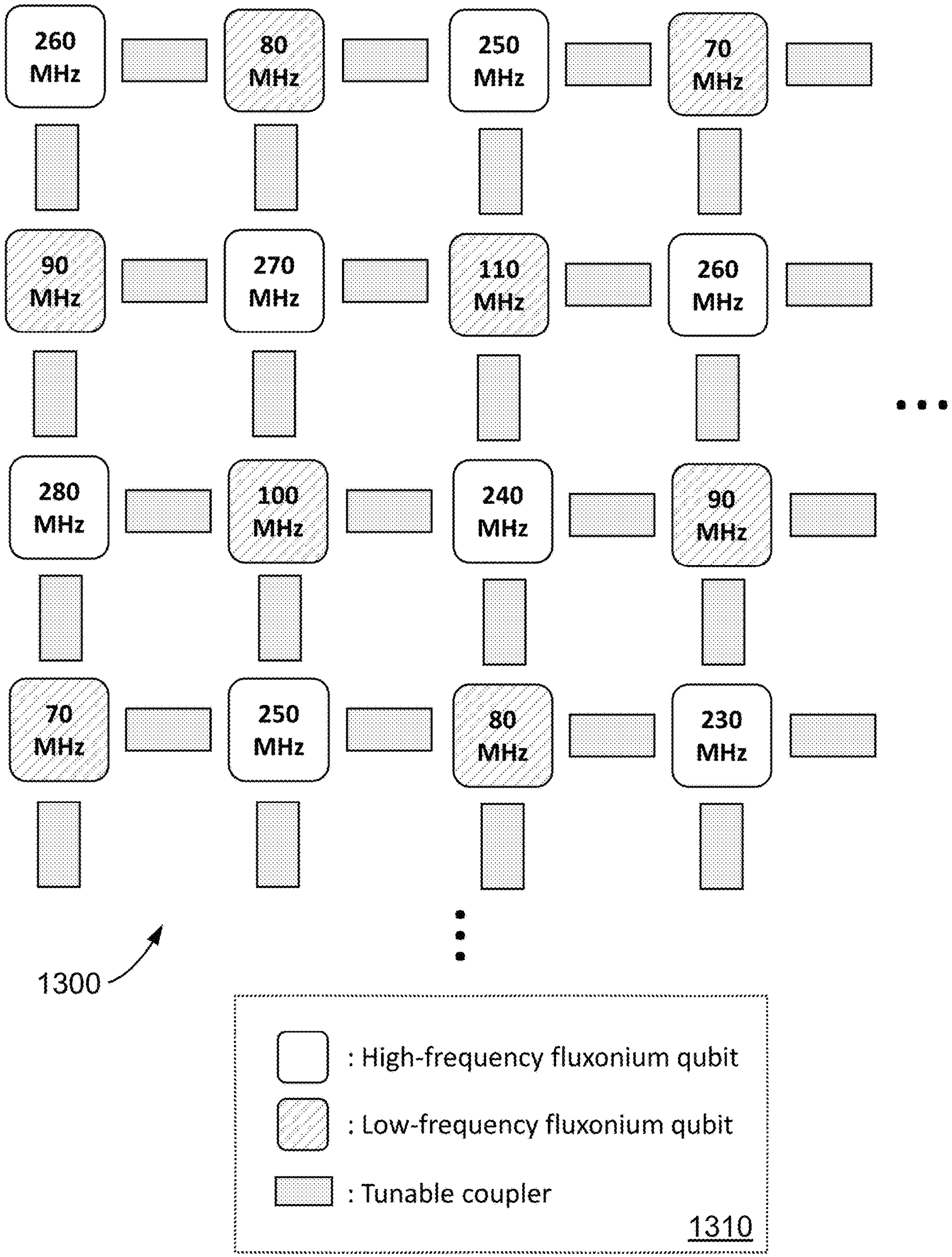
FIG. 13 is a schematic diagram of an example quantum computing architecture.

FIG. 13 shows an example quantum computing architecture 1300 comprising a number of quantum elements in an FTF arrangement. A legend 1310 denotes symbols used for high-frequency fluxonium qubits, low-frequency fluxonium qubits, and tunable couplers. As shown, the FTF architecture can form a unit cell that can be tiled into a 2D array of qubits. In some implementations, to prevent frequency collisions between neighboring fluxonium qubits during gate operations, qubits of high and low frequencies (e.g., 230 MHz and 70 MHZ, respectively) can be arranged in a checkerboard pattern. The numbers inside the fluxonium qubit tiles represent the qubit frequencies at their idle mode. The qubit frequency at the idle mode may be modified by changing device parameters (e.g., the Josephson energy $E_J$, capacitive energy $E_C$, and inductive energy $E_L$). For example, $E_J$ can be modified by changing the size or oxide thickness of the Josephson junction, $E_C$ can be modified by varying the size of the capacitor, and $E_L$ can be modified by varying the number of array junctions. Such an architecture may enable single- and two-qubit gates to be applied to multiple qubits simultaneously without frequency collisions.

In some examples, it may be advantageous to modify (e.g., sweep) the energy levels of two or more fluxonium qubits simultaneously, such that both qubits are moved away from their idle modes, possibly resulting in qubit dephasing due to flux noise. On the other hand, if only one fluxonium qubit is swept, the other qubit remains at the idle mode and does not suffer much dephasing due to flux noise. However, simultaneous sweeping of two fluxonium qubits can be advantageous, such as for increasing the speed of a two-qubit gate. For example, consider a case where qubit 1 has an idle mode frequency of 100 MHz, and qubit 2 has an idle mode frequency of 200 MHz. In order to implement an iSWAP gate, an external magnetic flux pulse applied to qubit 1 can bring it on-resonance with qubit 2 (e.g., |100>=|010>). However, since the qubits are at lower frequencies (e.g., 200 MHZ), the interaction between them is generally slower due to their small charge matrix element. To increase the charge matrix element, the qubit frequencies can be increased. Thus, applying magnetic flux pulses to both qubit 1 and qubit 2 can increase their respective frequencies simultaneously and bring them on resonant at a higher frequency (e.g., 400 MHZ, instead of 200 MHZ). This increases the effective coupling strength by a factor of $2^2=4$, allowing for a four times faster two-qubit gate at the possible expense of larger error resulting from qubit dephasing.

To realize a scalable and useful quantum computer, the errors that arise from the fundamental fragility of a quantum system may need to be corrected. These errors can be associated with the intrinsic loss of information (e.g., via decoherence and decay) or with control errors in the electromagnetic pulses that implement quantum gate operations on a quantum bit (also referred to as a qubit). In quantum error correction, the errors in the qubits are detected and subsequently corrected. For the implementation of such quantum error correction schemes, the uncorrected qubit operations may need to have a fidelity close to or exceeding 99%, for example, for single-qubit gates, two-qubit gates, and readout/measurement. Otherwise, the algorithmic and hardware overhead imposed by the quantum error correction may worsen the performance when compared to examples without quantum error correction. Such high fidelities can be challenging to achieve, and this is one reason that error correction has so far not been demonstrated at scale.

In general, quantum error correction may require data qubits that store a quantum state associated with the computation, as well as measure qubits that are used to detect errors associated with the data qubits. For example, a surface code is a quantum error correction algorithm that is implemented in a lattice geometry and may therefore be particularly compatible with planar superconducting circuit layouts.

A particularly detrimental issue in the implementation of quantum error correction is leakage to non-computational states. That is, over the runtime of an algorithm, a data or measure qubit may build up wave function population in a quantum state that is neither the computational 0 or 1 state, for example, wherein the wave function is associated with a probability for the qubit to be measured in a particular quantum state. Such non-computational states (e.g., excited 2, 3, 4, and higher states) of the qubit may be challenging to detect or distinguish from a computational state. For example, the measurement of a superconducting qubit may be configured to distinguish between two computational states, while adding the capability of performing readout of non-computational states may result in a slower or less accurate measurement operation.

Leakage can both affect qubits as well as couplers (e.g., couplers that take part in two-qubit operations, such as those disclosed herein). Such couplers may be a superconducting qubit circuit variant (e.g., a transmon) and may be kept in the ground state except when a quantum gate operation is performed. In addition, leakage events in one qubit or coupler can lead to enhanced leakage in other qubits or couplers, leading to additional errors across the quantum computing system. Therefore, leakage may need to be actively or passively reduced in order to practically scale quantum error correction algorithms. Since detecting leakage can be challenging or detrimental, leakage reduction operations may be applied to qubits even when they do not have population in non-computational states.

For example, a quantum algorithm may schedule leakage reduction operations at regular intervals so as to insure there is not buildup of population in non-computational states. Accordingly, leakage reduction operations may be designed so as to have a minimal effect on population in computational states (e.g., a qubit in a computational state $|1\rangle$ before a leakage reduction operation will remain in the computational state $|1\rangle$ after the leakage reduction operation).

In superconducting fluxonium qubit architectures, leakage to higher qubit states (i.e., higher excited states) may be naturally suppressed due to the relatively large anharmonicity of fluxonium (i.e., the frequency difference between the $|0\rangle-|1\rangle$ transition and the $|1\rangle-|2\rangle$ transition, given by $\omega_{12}-\omega_{01}$). In general, larger anharmonicity may lead to less buildup of population in higher-lying non-computational states (e.g., $|2\rangle$ $|3\rangle$, and $|4\rangle$ states) during quantum gates. However, some two-qubit gates may utilize interactions with the doubly-excited state of a qubit (i.e., the state $|2\rangle$) and may therefore be more prone to leakage. In addition, some quantum computing architectures may utilize a qubit with a relatively low-anharmonicity for coupling (e.g., transmons), thus increasing the possibility of leakage to non-computational coupler states. In some examples, the typical operating frequency of a fluxonium qubit is between 100 MHz and 1 GHz, while the operating frequency of a transmon qubit may range from 3-6 GHz. A fluxonium qubit may have positive anharmonicity (i.e., $\omega_{12}-\omega_{01}>0$) that can typically range from 3-6 GHz. In contrast, a transmon qubit may have negative anharmonicity (i.e., $\omega_{12}-\omega_{01}<0$) that can typically range from −300 to −150 MHz. The differences in the qubit frequency and anharmonicity between transmons may necessitate consideration when implementing leakage reduction pulses, for example, as such differences can change the allocation of frequency for a lossy mode (e.g., a mode of a resonator) which can rapidly dissipate its energy into the environment (e.g., a transmission line). Moreover, a transmon qubit may only allow a one-photon transition (e.g., $|n\rangle \rightarrow |n\pm1\rangle$), whereas a fluxonium qubit may not have such restrictions. This distinction enables the exploration of new, possibly more flexible energy transfer schemes from higher qubit states to the lossy mode.

This disclosure contains several methods for the reduction of leakage in superconducting circuits. In some examples, leakage reduction may be performed in a setting wherein a plurality of measure qubits are measured more frequently than a plurality of data qubits. For example, quantum error correction algorithms (e.g., surface codes) may require data qubits that store a quantum state associated with the computation, as well as measure qubits that are used to detect errors on the data qubits (e.g., via syndrome extraction). Measure qubits may be ancilla qubits prepared in a superposition state (e.g., by application of a Hadamard gate) that then take part in one or more multi-qubit gates acting on one or more data qubits that can be encoded in a logical state. After the one or more multi-qubit gates, the measure qubits may have an additional single-qubit gate applied to them (e.g., a Hadamard gate) and can be subsequently measured to provide information on any errors that may have occurred on the data qubits. Such information may then be used to correct or reduce the detected errors by applying appropriate quantum gates to the data qubits.

In some examples, the types of errors detected may be a bit flip (e.g., $|0\rangle \leftrightarrow |1\rangle$), a phase flip $$\left(\text{e.g., } \frac{1}{\sqrt{2}}(|0\rangle + |1\rangle) \leftrightarrow \frac{1}{\sqrt{2}}(|0\rangle - |1\rangle)\right),$$

or both (e.g., $|0\rangle \leftrightarrow i|1\rangle$), respectively corresponding to the Pauli matrices X, Z, and Y. Such errors may correspondingly be referred to as Pauli errors.

If leakage to non-computational states occurs in a data qubit, some quantum error correction codes may not be able to correct such errors, or it may even lead to undesirable and unpredictable outcomes of the error correction. However, the fact that measure qubits are measured with some regularity lends itself to a possible leakage reduction scheme, whereby population of non-computational states of a data qubit can be reduced or eliminated by performing a quantum gate that transfers at least a portion of the non-computational population of the data qubit to a measure qubit. Since the measure qubit is subsequently measured, and other measure qubits may be used to provide additional redundancy, the negative effect of the excitation transfer to the measure qubit may be short-lived and corrected if necessary (e.g., by applying additional rounds of quantum error correction, or by incorporating other redundancies into the quantum error correction algorithm). Thus, not only can performing leakage reduction be beneficial in the context of quantum error correction, it can also leverage the quantum error correction code to assist with some leakage reduction schemes.

It is emphasized that the language and framework of quantum error correction codes are used to enhance understanding of some of the disclosed leakage reduction schemes, but that such schemes can also be applied in different contexts, so long as they comprise qubits that (1) undergo leakage errors and (2) are measured less frequently than other qubits that they can be coupled to.

The notation $|N\rangle$ denotes that a qubit is in a quantum state that has N excitations with respect to the ground state of the qubit, which is denoted $|0\rangle$. For example, $|3\rangle$ would denote that the qubit is in a state that has three excitations. Modifiers may be used to further specify to what class a qubit belongs, for example, $|1\rangle_{data}$ and $|1\rangle_{measure}$ denote data and measure qubits, respectively, that are in the singly-excited state.

In some examples, a non-computational state may be any state that is not $|0\rangle$ or $|1\rangle$. In the following leakage reduction schemes, $|2\rangle_{data}$ is an example non-computational state of a data qubit that has at least a portion of its excitation transferred to a measure qubit originally in the state j$|0\rangle_{measure}$. Thus, the measure qubit is in a state $|1\rangle_{measure}$ and the data qubit is in a state $|0\rangle_{data}$ or $|1\rangle_{data}$ after the leakage reduction operation, depending on the leakage reduction scheme applied. Some example leakage reduction schemes perform one or more quantum operations that transfer the data and measure qubits from the joint state $|2\rangle_{data}|0\rangle_{measure}$ to either the joint state $|1\rangle_{data}|1\rangle_{measure}$ or the joint state $|0\rangle_{data}|1\rangle_{measure}$ by applying a magnetic flux pulse to the measure qubit (e.g., through a superconducting loop associated with the measure qubit and based at least in part on the energy levels shown in FIGS. 6A, 6B, and 6C) to tune the energy of the measure qubit (e.g., the energy levels of a joint state comprising qubits with tunable energies are shown in FIGS. 8A, 8B, and 8C). Furthermore, one or more magnetic flux pulses can be designed to transfer population for even higher non-computational states of the data qubits (e.g., $|3\rangle_{data}$ or $|4\rangle_{data}$).

Other example leakage reduction schemes transfer the data and measure qubits from the joint state $|2\rangle_{data}|0\rangle_{measure}$ to either the joint state $|1\rangle_{data}|1\rangle_{measure}$ or the joint state $|0\rangle_{data}|1\rangle_{measure}$ by applying at least one magnetic flux pulse to the data qubit and at least one magnetic flux pulse to the measure qubit. A direct transition between the joint state $|2\rangle_{data}|0\rangle_{measure}$ and the joint state $|0\rangle_{data}|1\rangle_{measure}$ can be difficult or impossible for two transmons, but such a transition is possible for two fluxonium qubits. The transition is possible for two fluxonium qubits due to the potential well of a given fluxonium qubit giving rise to wave functions for the states $|2\rangle$ and $|0\rangle$ that can have substantial overlap. The overlap of the wave functions of the states $|2\rangle$ and $|0\rangle$ of a given fluxonium qubit can depend on the flux applied to (i.e., the biasing of) the fluxonium qubit. In some examples, the wave function overlap may be smaller at the idle point of a fluxonium qubit (i.e., at a half-integer flux quantum), and may increase away from the idle point. In order to drive a transition between two quantum states, the wave functions of the two quantum states must have overlap, otherwise the transition is suppressed.

Parametric resonance occurs when a magnetic flux pulse induces an oscillation in an effective coupling strength between two quantum states, wherein the frequency of the induced oscillation is equal or close to (e.g., within 20% of) the frequency difference between the two quantum states.

Figure 14:
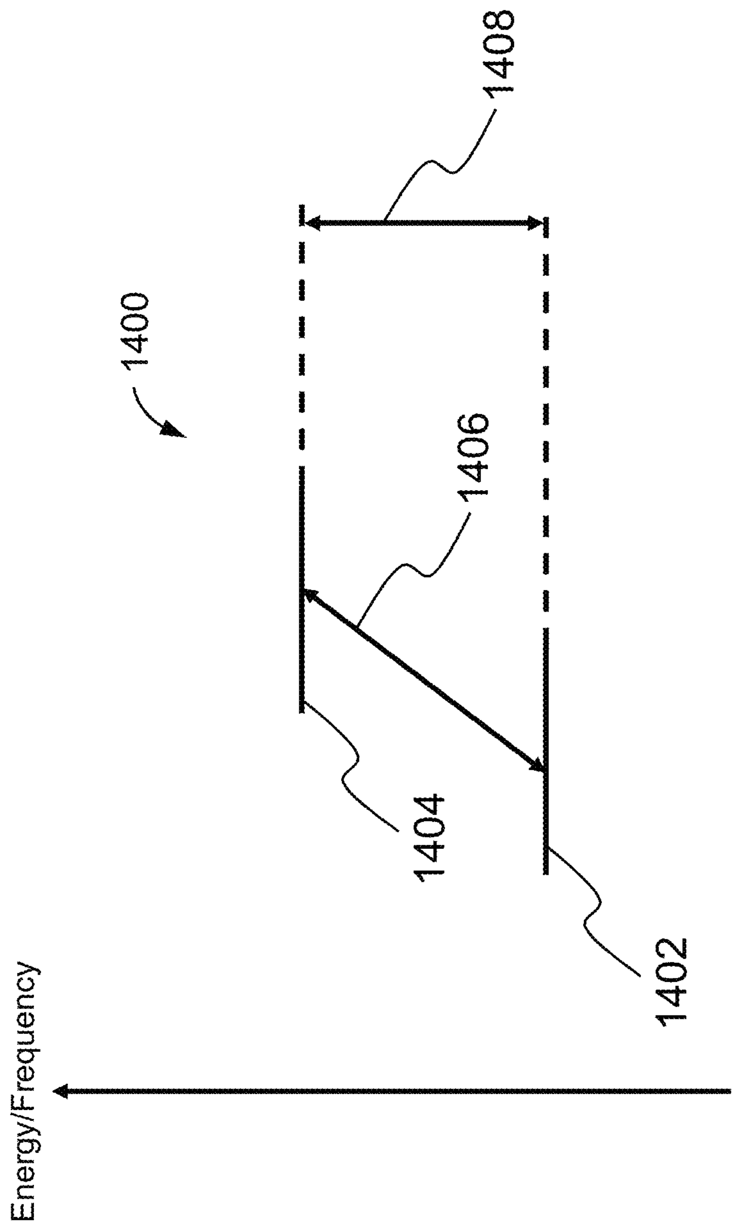
FIG. 14 shows a schematic energy/frequency level diagram of two quantum states that are coupled.

FIG. 14 shows an energy/frequency level diagram 1400 comprising a first quantum state 1402 and a second quantum state 1404 that are coupled by an effective coupling strength 1406 and separated by a frequency detuning 1408. The first quantum state 1402 and the second quantum state 1404 are coupled by a static effective coupling strength $g_0$ when no magnetic flux pulse is applied. When a magnetic flux pulse is applied, the first quantum state 1402 and the second quantum state 1404 are coupled by an effective coupling strength $g(t)=g_0+A_g\cos(\omega_g t)$, where $A_g$ is a constant, $\omega_g$ is the coupling frequency between the two quantum states, and t is time. The coupling frequency ($\omega_g$) is induced by the magnetic flux pulse and depends at least in part on the frequency of the magnetic flux pulse. When the coupling frequency ($\omega_g$) is equal or close to (e.g., within 20% of) the frequency detuning 1408, the coupling frequency is said to be resonant or near-resonant with the frequency detuning 1408 and the first quantum state 1402 and the second quantum state 1404 begin to exchange or transfer quantum state population. The rate at which quantum state population is transferred depends at least in part on the coupling frequency. In general, the first quantum state 1402 and the second quantum state 1404 can be multi-qubit states comprising quantum states from two or more quantum elements (e.g., two or more fluxonium superconducting circuits or a fluxonium superconducting circuit and a resonator circuit). Furthermore, the effective coupling strength 1406 can depend at least in part on a qubit coupling circuit (not shown) that is configured to couple the first quantum state 1402 and the second quantum state 1404. In some examples, the qubit coupling circuit comprises a tunable superconducting circuit that has at least one tunable characteristic.

Figure 15B:
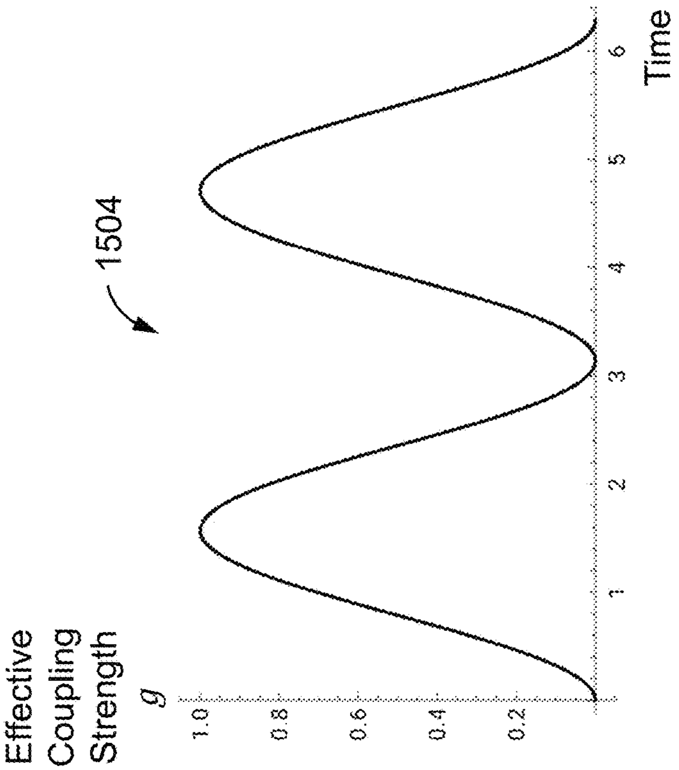
FIG. 15B shows an example prophetic plot of the effective coupling strength between a fluxonium superconducting circuit and a resonator circuit as a function of time.
Figure 15A:
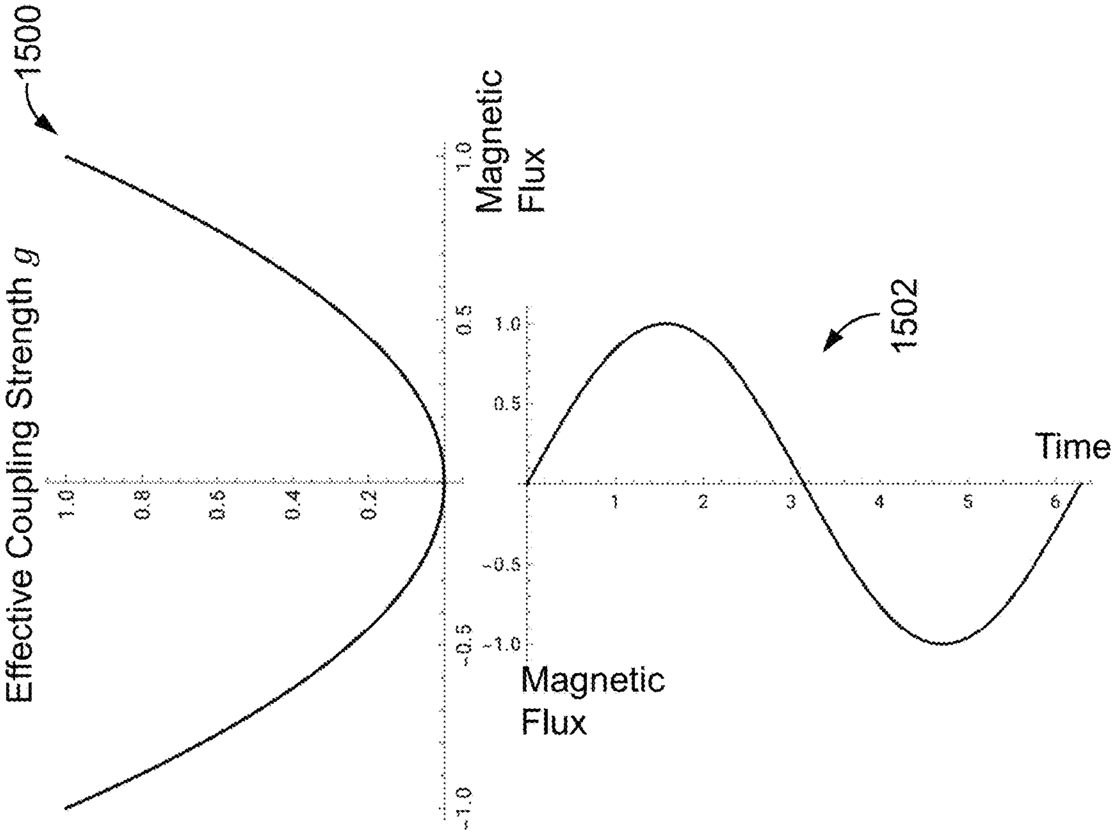
FIG. 15A shows an example prophetic plot of the effective coupling strength between a fluxonium superconducting circuit and a resonator circuit as a function of magnetic flux and an example prophetic plot of a magnetic flux pulse.

FIGS. 15A and 15B show a prophetic example of determining a coupling frequency ($\omega_g$) from a magnetic flux pulse frequency ($\omega_f$).

FIG. 15A shows an example prophetic plot of the effective coupling strength between a fluxonium superconducting circuit and a resonator circuit as a function of magnetic flux 1500. In this example, the effective coupling strength has a quadratic dependence on the magnetic flux. Also shown is an example prophetic plot of a magnetic flux pulse 1502 that oscillates with a magnetic flux pulse frequency ($\omega_f$).

FIG. 15B shows an example prophetic plot of the effective coupling strength between a fluxonium superconducting circuit and a resonator circuit as a function of time 1504. The effective coupling strength oscillates with a coupling frequency ($\omega_g$) that is twice that of the magnetic flux pulse frequency ($\omega_f$), such that $\omega_g=2\omega_f$, in this example. For this example, the relationship between the magnetic flux pulse frequency and the coupling frequency can be determined by the following steps. The effective coupling strength obeys the following formula: $g=\phi(t)^2$, where $\phi(t)$ is the magnetic flux as a function of time. However, as shown in the prophetic plot of a magnetic flux pulse 1402, $\phi(t)=\sin(\omega_f t)$ in this example. Therefore, $$g=[\sin(\omega_f t)]^2=\frac{1}{2}[1-\cos(2\omega_f t)].$$

Thus, the effective coupling strength (e.g., the effective coupling strength 1406 in FIG. 14) oscillates with a coupling frequency $\omega_g=2\omega_f$. Parametric resonance occurs when the coupling frequency is equal to the frequency difference between two multi-qubit states. When the coupling frequency is equal to the frequency difference, the rate at which quantum state population between the two multi-qubit states is transferred depends at least in part on the amplitude of the oscillation of the effective coupling strength. In general, the effective coupling strength does not necessarily have a quadratic dependence on the magnetic flux, and other magnetic flux pulses may be applied. In such cases, the coupling frequency can still be determined by techniques similar to those described above or by other methods.

In general, the energy (i.e., frequency) of the quantum states can depend on the magnetic flux pulse itself (e.g., the energy of a fluxonium qubit circuit depends on the magnetic flux applied to it, and therefore changes during a magnetic flux pulse). Thus, the resonance energy of the parametric resonance can depend on the energy of the qubit during the magnetic flux pulse. In some examples, a fluxonium qubit has an average energy during a magnetic flux pulse that depends on the magnetic flux pulse itself (e.g., the amplitude and the frequency of the magnetic flux pulse). The average energy of the fluxonium qubit during the magnetic flux pulse is typically different from the average energy of the fluxonium qubit when the flux pulse is not actively being applied. For example, the average energy of the fluxonium qubit during the magnetic flux pulse can depend on the second derivative of the energy of the qubit with respect to magnetic flux applied to the fluxonium qubit. The second derivative is used as an example for when the fluxonium qubit energy is at a local minimum in energy before the flux pulse is applied (e.g., at the idle mode), thus leading to a second-order Taylor expansion. If the magnetic flux pulse is large in amplitude or the fluxonium qubit is not at the idle mode, the average energy may not depend on the second derivative but may still be determined either by calculation or experimentally.

In contrast to parametric resonance, baseband magnetic flux pulses can be used to tune the energy of the joint quantum states directly, so as to make the energy difference between two joint quantum states small (e.g., within 20% of one of their energies) and thereby increase the effective coupling strength between the two multi-qubit states. Baseband magnetic flux pulses may be performed such that there is no periodic oscillation of the effective coupling strength.

Thus, a magnetic flux pulse may be applied to the to at least one of (1) the data qubit or (2) the measure qubit so as to drive parametric resonance, thereby transferring the data and measure qubits from the joint state $|2\rangle_{data}|0\rangle_{measure}$ to either the joint state $|1\rangle_{data}|1\rangle_{measure}$ or the joint state $|0\rangle_{data}|1\rangle_{measure}$. Additionally, if the energy of the data qubit is tuned away from the idle point (i.e., away from a half-integer flux quantum), for example by applying a magnetic flux to the data qubit, then a magnetic flux pulse may also be applied to at least one of the measure qubit or the data qubit so as to drive parametric resonance, thereby transferring the data and measure qubits from the joint state $|2\rangle_{data}|0\rangle_{measure}$ to either the joint state $|1\rangle_{data}|1\rangle_{measure}$ or the joint state $|0\rangle_{data}|1\rangle_{measure}$. In general, leakage reduction operations may be applied to data and measure qubits that are coupled via a tunable coupler or that are directly coupled (e.g., via capacitive or inductive couplings).

Regardless of whether the leakage reduction operations use baseband or parametric magnetic flux pulses, by performing such transfers of excitations, leakage errors can be converted into a Pauli error, which can be captured and corrected in the next quantum error correction cycle. After the transfer, the state $|1\rangle_{measure}$ of the measure qubit can be actively reset to its ground state $|0\rangle_{measure}$ (e.g., by transferring the one or more excitations of the measure qubit to a lossy mode, as disclosed herein).

In the following leakage reduction operations, $|2\rangle_{qubit}$ is an example non-computational state of a qubit that has at least a portion of its excitation transferred to a resonator, or any other lossy mode element, originally in the state $|0\rangle_{resonator}$. Thus, the resonator is in a state $|1\rangle_{resonator}$ and the qubit is in a state $|0\rangle_{qubit}$ or $|1\rangle_{qubit}$ after the leakage reduction operation, depending on the leakage reduction scheme applied. The resonator can be configured such that when the resonator has population in excited states associated with its quantum state, the excited state population will decay to the ground state of the resonator over a period of time that can be much faster than similar decay processes in superconducting qubits used for computations (e.g., transmons or fluxonium). Although a resonator is used as an example of an element with a possibly rapidly decaying excited state population, other elements may be used as well. Some example leakage reduction schemes perform one or more quantum operations that transfer the qubit and the resonator from the joint state $|2\rangle_{qubit}|0\rangle_{resonator}$ to either the joint state $|1\rangle_{qubit}|1\rangle_{resonator}$ or the joint state $|0\rangle_{qubit}|1\rangle_{resonator}$ by applying a magnetic flux pulse to the resonator, if it is flux-tunable, or the qubit (e.g., through a superconducting loop associated with the resonator and based at least in part on the energy levels shown in FIGS. 5A, 5B, and 5C) to tune the energy of the resonator or the qubit. Other example leakage reduction schemes transfer the qubit and resonator from the joint state $|2\rangle_{qubit}|0\rangle_{resonator}$ to either the joint state $|1\rangle_{qubit}|1\rangle_{resonator}$ or the joint state $|0\rangle_{qubit}|1\rangle_{resonator}$ by applying at least one magnetic flux pulse to the qubit and at least one magnetic flux pulse to a flux-tunable resonator. Furthermore, one or more magnetic flux pulses that are applied can be designed to transfer population for even higher non-computational states of the qubits (e.g., $|3\rangle_{qubit}$ or $|4\rangle_{qubit}$). Magnetic flux pulses may also be applied to the qubit or a flux-tunable resonator so as to drive parametric resonance, thereby transferring the qubit and resonator from the joint state $|2\rangle_{qubit}|0\rangle_{resonator}$ to either the joint state $|1\rangle_{qubit}|1\rangle_{resonator}$ or the joint state $|0\rangle_{qubit}|1\rangle_{resonator}$. Parametric resonance occurs when an applied magnetic flux pulse induces an oscillation of the effective coupling strength between the qubit and resonator, wherein the frequency of the induced oscillation is similar to the energy difference between two quantum states or two joint quantum states. If the resonator is flux-tunable, one or more magnetic flux pulses can be applied to just the resonator, or to the qubit as well, so as to drive parametric resonance, thereby transferring the qubit and resonator from the joint state $|2\rangle_{qubit}|0\rangle_{resonator}$ to either the joint state $|1\rangle_{qubit}|1\rangle_{resonator}$ or the joint state $|0\rangle_{qubit}|1\rangle_{resonator}$. Additionally, if the energy of the qubit is tuned away from the idle point (i.e., away from a half-integer flux quantum), for example by applying a magnetic flux to the qubit, then a magnetic flux pulse may also be applied to at least one of the qubit or a flux-tunable resonator so as to drive parametric resonance, thereby transferring the qubit and resonator from the joint state $|2\rangle_{qubit}|0\rangle_{resonator}$ to either the joint state $|1\rangle_{qubit}|1\rangle_{resonator}$ or the joint state $|0\rangle_{qubit}|1\rangle_{resonator}$. In general, the resonator may be populated with multiple photons in the process, which may not necessarily cause an issue due to its rapid decay of excited state population.

In the following leakage reduction operations, $|2\rangle_{qubit}$ is an example non-computational state of a qubit that has at least a portion of its excitation transferred, via a coupler, to a resonator, or any other lossy mode element, originally in the state $|0\rangle_{resonator}$. Thus, the resonator is in a state $|1\rangle_{resonator}$ and the qubit is in a state $|0\rangle_{qubit}$ or $|1\rangle_{qubit}$ after the leakage reduction operation, depending on the leakage reduction scheme applied. Some example leakage reduction schemes perform one or more quantum operations that transfer the qubit and the coupler from the joint state $|2\rangle_{qubit}|0\rangle_{coupler}$ to either the joint state $|1\rangle_{qubit}|1\rangle_{coupler}$ or the joint state $|0\rangle_{qubit}|1\rangle_{coupler}$ by applying a magnetic flux pulse to the coupler or the qubit (e.g., through a superconducting loop associated with the coupler and based at least in part on the energy levels shown in FIGS. 6A, 6B, and 6C) to tune the energy of the coupler.

Other example leakage reduction schemes transfer the qubit and coupler from the joint state $|2\rangle_{qubit}|0\rangle_{coupler}$ to either the joint state $|1\rangle_{qubit}|1\rangle_{coupler}$ or the joint state $|0\rangle_{qubit}|1\rangle_{coupler}$ by applying at least one magnetic flux pulse to the qubit and at least one magnetic flux pulse to the coupler. Furthermore, one or more magnetic flux pulses can be designed to transfer population for even higher non-computational states of the qubits (e.g., $|3\rangle_{qubit}$ or $|4\rangle_{qubit}$). Magnetic flux pulses may also be applied to at least one of (1) the qubit or (2) the coupler so as to drive parametric resonance, thereby transferring the qubit and the coupler from the joint state $|2\rangle_{qubit}|0\rangle_{coupler}$ to either the joint state $|1\rangle_{qubit}|1\rangle_{coupler}$ or the joint state $|0\rangle_{qubit}|1\rangle_{coupler}$. Parametric resonance occurs when an applied magnetic flux pulse has an energy that is similar to the energy difference between two quantum states or two joint quantum states. Recall that, in general, the energy of the quantum states can depend on the magnetic flux pulse itself (e.g., the energy of a fluxonium qubit circuit depends on the magnetic flux applied to it, and therefore changes during a magnetic flux pulse). Thus, the resonance energy of the parametric resonance can depend on the energy of the qubit during the magnetic flux pulse. In some examples, a fluxonium qubit has an average energy during a magnetic flux pulse that depends on the magnetic flux pulse itself (e.g., the amplitude and the frequency of the magnetic flux pulse). The average energy of the fluxonium qubit during the magnetic flux pulse is typically different from the average energy of the fluxonium qubit when the flux pulse is not actively being applied.

Additionally, if the energy of the qubit is tuned away from the idle point (i.e., away from a half-integer flux quantum), for example by applying a magnetic flux to the qubit, then a magnetic flux pulse may also be applied to the coupler so as to drive parametric resonance, thereby transferring the qubit and coupler from the joint state $|2\rangle_{qubit}|0\rangle_{coupler}$ to either the joint state $|1\rangle_{qubit}|1\rangle_{coupler}$ or the joint state $|0\rangle_{qubit}|1\rangle_{coupler}$.

If some or all of the excitation is transferred from the qubit to the coupler (e.g., the coupler state is $|1\rangle_{coupler}$), then the coupler may transfer the excitation to a lossy mode element (e.g., a resonator). For example, a swap operation can be performed between the coupler and the resonator. Such swap operations may be accomplished by applying one or more magnetic flux pulses to at least one of (1) the coupler or (2) the resonator, if the resonator is tunable. The one or more magnetic flux pulses can be baseband or parametric, and can transfer the coupler and the resonator from the joint state $|1\rangle_{coupler}|0\rangle_{resonator}$ to the joint state $|0\rangle_{coupler}|1\rangle_{resonator}$. Sideband cooling techniques, whereby individual excitation levels are resolved by one or more magnetic flux pulses, can be used to lower the excitation quantum number of a qubit or coupler quantum state. If the resonator is flux-tunable, magnetic flux pulses may be applied to the resonator to induce sideband cooling.

In the following leakage reduction operations, $|2\rangle_{qubit}$ is an example non-computational state of a qubit that has at least a portion of its excitation transferred, via a coupler, to a resonator, or any other lossy mode element, originally in the state $|0\rangle_{resonator}$. Thus, the resonator is in a state $|1\rangle_{resonator}$ and the qubit is in a state $|0\rangle_{qubit}$ or $|1\rangle_{qubit}$ after the leakage reduction operation, depending on the leakage reduction scheme applied. The coupler couples the qubit and the resonator, where the coupling is associated with a coupling frequency. Some example leakage reduction schemes use parametric resonance to perform one or more quantum operations that transfer the qubit, coupler, and resonator from the joint state $|2\rangle_{qubit}|0\rangle_{coupler}|0\rangle_{resonator}$ to either the joint state $|1\rangle_{qubit}|0\rangle_{coupler}|1\rangle_{resonator}$ or the joint state $|0\rangle_{qubit}|0\rangle_{coupler}|1\rangle_{resonator}$ by applying a parametric magnetic flux pulse to the coupler. The two different final joint states above are reached by virtual joint states (i.e., joint states that accumulate much less population and serve to couple the initial and final joint states) $|1\rangle_{qubit}|1\rangle_{coupler}|0\rangle_{resonator}$ and $|0\rangle_{qubit}|1\rangle_{coupler}|0\rangle_{resonator}$, respectively. Parametric resonance is achieved when the magnetic flux pulse induces oscillations in the effective coupling strength between quantum states at a coupling frequency (e.g., as discussed in FIGS. 14, 15A, and 15B), where the coupling frequency is equal or close to (e.g., within 20% of) the frequency difference between the quantum states.

Qubits may need to be reset to their ground state (i.e., $|0\rangle$ ) for various reasons in quantum algorithms. Resetting operations can use quantum operations similar to those used in leakage reduction. Additionally, resetting operations may be designed to transfer one or more excited state populations, including computational states, to the ground state. Thus, while leakage reduction operations are often designed to apply to non-computational states, reset operations may apply to computational states. Reset can also be important for error correction algorithms in particular, where measure qubits may need to be reset more often than data qubits.

Some reset operations may utilize a tunable resonator, which may be formed by adding tunability to a readout resonator (i.e., a resonator used for measurement of quantum states associated with one or more qubits) or by adding a tunable resonator to a qubit. By terminating a resonator in a SQUID, the energy spectrum of a resonator can be made tunable. In such an example of a tunable resonator, the energy (i.e., frequency) of quantum states associated with resonator can be changed by applying magnetic field flux pulses or by applying constant magnetic flux through a superconducting loop that comprises the SQUID. In some applications, the tunable resonator may idle at a frequency that is far-detuned from (i.e., not of a similar value to frequencies associated with) the qubit and that is far-detuned from other resonators most of the time, thus reducing undesired interactions of the tunable resonator with other quantum computing elements. When a reset operation is to be performed, the resonator may be brought on resonance with the qubit and the qubit excitation can be transferred to the resonator. As a result of tuning the resonator frequency away from the qubit resonance when not in use, the T1 and T2 times of the qubit are protected (e.g., at the idle point) from loss and noise resulting from the resonator.

A frequency-tunable resonator can be implemented by terminating a quarter-wave resonator with a SQUID at the anti-node of the current. The SQUID can be either a dc-SQUID or an RF-SQUID depending on the tunability, linearity, and other requirements. Threading magnetic flux through the tunable resonator SQUID loop changes the effective terminating inductance of the resonator, thereby changing its resonator frequency (i.e., energy). A resonator may be designed and fabricated such that at the "OFF" point, which may or may not be at zero magnetic flux through the superconducting loop comprising the SQUID, a quantum state (e.g., the singly-excited state) of the resonator is at a very high frequency relative to one or more quantum states associated with the qubit. For example, a quantum state of the resonator may have a resonance frequency greater than or close to 5 GHz, while a quantum state of the qubit may have a resonant frequency less than 1 GHz. At this "OFF" point, the qubit-resonator interaction can be negligible, even for a directly coupled qubit-resonator arrangement. At the same time, the thermal population of the resonator (i.e., the population of photons in the resonator due to the resonator being at a finite temperature) will be much smaller than that of the qubit's thermal population, as determined in part by the Boltzmann coefficient, KB. For a given environment temperature, T, the ratio of the excited state population of the resonator to the excited state population of the qubit is exponential (i.e., $e^{-hw/k_BT}$) in their frequency difference, w. Thus, a resonator with a 10 GHZ frequency has a significantly lower excited state population than a qubit with a 200 MHz frequency (e.g., by more than ten orders of magnitude) when placed in a dilution refrigerator with a temperature of approximately 10 mK.

In one example qubit reset scheme, a magnetic flux pulse can be applied through the superconducting loop of the resonator that comprises a SQUID in order to lower the resonance frequency to the "ON" point, wherein the resonator will swap population with the qubit state that is to be reset. Such an operation may be done faster than the thermalization timescale of the resonator so as to not populate stray modes from thermal photons while the resonator resonance is modified to lower frequencies. After the swap, the resonator can return to its "OFF" point where its excited state population, now increased after the swap, can passively decay (e.g., to a transmission line used for measurement) back to the low thermal value. The resonator can be used repeatedly for such reset operations.

In another example qubit reset scheme, a magnetic flux pulse can drive a parametric resonance such that the magnetic flux pulse induces an oscillation of the effective coupling strength between the qubit and resonator, wherein the frequency of the induced oscillation is substantially similar to (e.g., within 20% of) the energy difference between the qubit and resonator states. For example, in some examples, a parametric resonance can be achieved by driving the qubit, or by driving the resonator. Such a parametric drive can transfer the excited state population of the qubit to the resonator, after which the excited state population of the resonator will decay to a transmission line.

In another example qubit reset scheme, a tunable coupler that is coupled to both a resonator and a qubit can be used. In such a configuration, a magnetic flux pulse can be applied to transfer the qubit and the coupler from the joint state $|1\rangle_{qubit}|0\rangle_{coupler}$ to the joint state $|0\rangle_{qubit}|1\rangle_{coupler}$. Such a transfer can be accomplished in a variety of ways. For example, the frequency difference between the joint states $|1\rangle_{qubit}|0\rangle_{coupler}$ and $|0\rangle_{qubit}$ and $|1\rangle_{coupler}$ can be dynamically tuned to be small (e.g., by applying a baseband magnetic flux pulse to either the qubit, the coupler, or both. Or, instead of a baseband magnetic flux pulse, a parametric magnetic flux pulse can be applied to parametrically drive at least one of (1) the qubit or (2) the coupler, such that the magnetic flux pulse induces an oscillation in the effective coupling strength between the joint states wherein the frequency of the oscillation is substantially similar to (e.g., within 20% of) the frequency difference between the joint states. After parametric or baseband magnetic flux pulses, for example, the qubit and/or coupler can be tuned back to a normal operation bias point (i.e., the magnetic flux biasing the qubit and/or coupler can be increased or decreased from the value used during the swap of excitation between the qubit and the coupler). Then, the excited state population transferred to the coupler can now be transferred to a resonator or another lossy mode within the quantum computing system. Such a transfer from the coupler to a resonator can be accomplished by similar means to those described in the previous swap operation (e.g., a parametric or baseband magnetic flux pulse can be used). In some examples, a tunable resonator may be used, thus allowing for magnetic flux pulses to tune the energy levels of the resonator or to parametrically drive the resonator to transfer the excited state population of the coupler to the resonator.

Figures 16A, 16B, 16C:
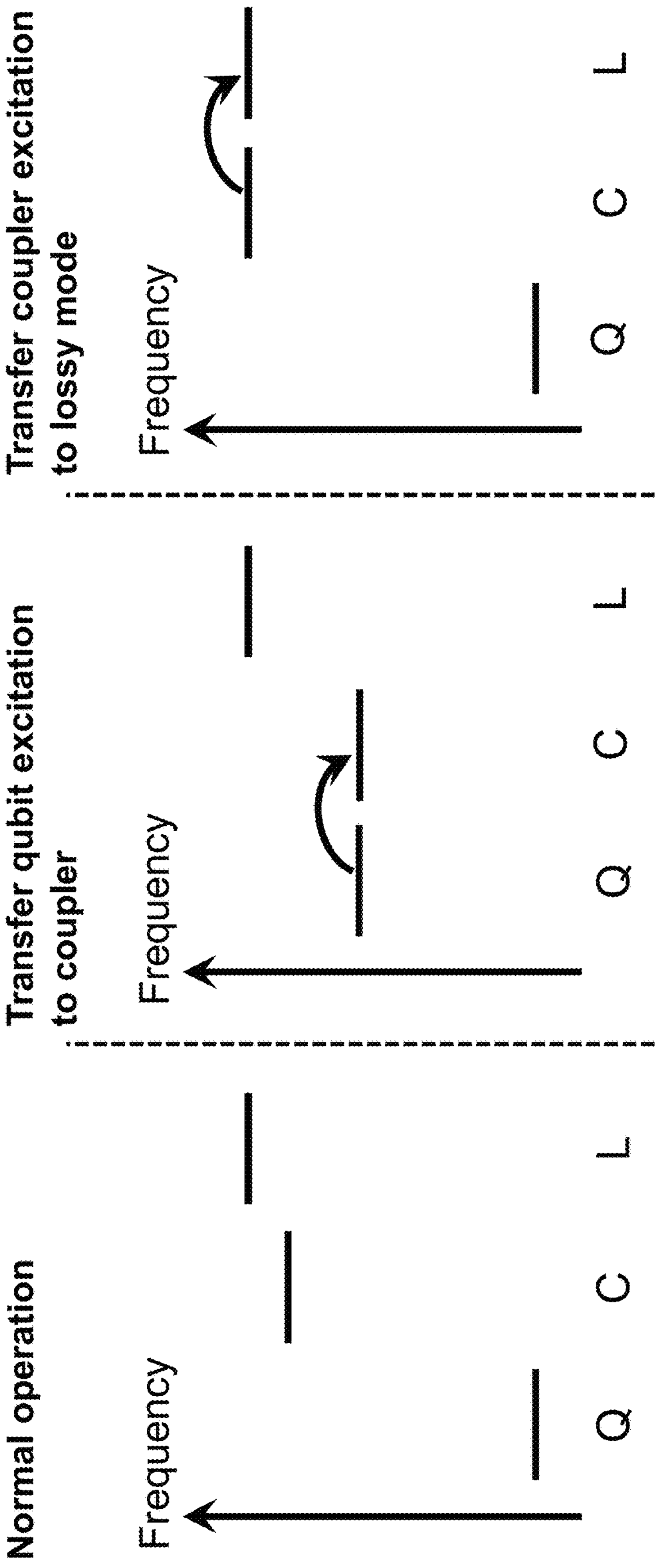
FIGS. 16A, 16B, and 16C are schematic diagrams that collectively show an example procedure of tuning energy levels to transfer one or more excitations across elements in a quantum computing system.

FIGS. 16A, 16B, and 16C collectively show an example procedure of tuning energy levels, associated with a qubit ("Q"), a coupler ("C"), and a lossy mode element ("L"), in order to transfer one or more excitations across elements in a quantum computing system. In some examples, the lossy mode element can be a resonator, which itself may be tunable in energy. A lossy mode element has an excited state that decays more rapidly than the excited state of the qubit. Thus, by transferring one or more excitations from a qubit to a lossy mode element, the excitations can decay more rapidly and allow the quantum computing system to remove unwanted leakage (e.g., population of non-computational states) or to reset a qubit (e.g., to its ground state, so that it can be used for future computations).

FIG. 16A shows example energy levels that may occur during normal operation (e.g., when performing computational tasks on the quantum computer system). It is emphasized that although the energy of the qubit is lower than both the coupler and lossy mode element energies in this example of normal operation, the procedure for transferring one or more excitations away from the qubit can be used in other energy level arrangements, for example, when the qubit energy is higher than both the coupler and lossy mode element energies, or is between the energy of the coupler and the energy of the lossy mode element.

FIG. 16B shows example energy levels for transferring one or more excitations from the qubit to the coupler. One or more magnetic flux pulses can be applied to at least one of (1) the qubit or (2) the coupler in order to tune their energies to be substantially equal (e.g., within 20% of one of their energy values). The magnetic flux pulses can have their duration, amplitudes, and pulse shapes, for example, modified to enhance the transfer efficiency of the one or more excitations from the qubit to the coupler, or to shorten the transfer time, for example.

FIG. 16C shows example energy levels for transferring one or more excitations from the coupler to the lossy mode element (e.g., a resonator). One or more magnetic flux pulses can be applied to at least one of (1) the coupler or (2) the lossy mode element in order to tune their energies to be substantially equal (e.g., within 20% of one of their energy values). The magnetic flux pulses can have their duration, amplitudes, and pulse shapes, for example, modified to enhance the transfer efficiency of the one or more excitations from the coupler to the lossy mode element, or to shorten the transfer time, for example. The excitation transferred to the lossy mode element may then decay (e.g., as photons into a transmission line used for measurements), thus resetting the lossy mode element to its ground state after a duration of time.

A further consideration of leakage reduction operations relates to when such operations should be scheduled in a quantum algorithm. In some examples, leakage reduction operations can be applied during a quantum error correction cycle to suppress leakage build-up. More generally, leakage reduction operations may be applied at various stages throughout any quantum algorithm, particularly if the occurrence of leakage errors is detrimental to the overall fidelity of the algorithm. For example, some of the two-qubit quantum gates disclosed herein utilize one or more non-computational states (e.g., of a coupler in an FTF configuration). Although population of non-computational states may be designed to occur only during the quantum gate operation, such two-qubit gates may inadvertently lead to unwanted leakage that can be subsequently addressed by leakage reduction operations. It may also be the case that certain single-qubit gates lead to unwanted leakage, and thus it may be desirable to perform leakage reduction operations after their execution.

The architecture of a quantum computing system can be flexible and may depend on constraints imposed by space, connectivity, and the quantum gates to be performed. In some example architectures, each qubit can be coupled to its own lossy mode element (e.g., a resonator). In other examples, multiple qubits can share one lossy mode element. Furthermore, qubits and lossy mode elements may be coupled to one another via a tunable coupler (e.g., a transmon). In some examples of the FTF configuration, two fluxonium qubits that are coupled to one another by a tunable coupler can also be coupled to a lossy mode element through the same tunable coupler.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for performing at least one quantum gate operation on a quantum processor, the method comprising:

applying a first magnetic field flux pulse through a first inductive loop associated with a first superconducting circuit; and where, during a portion of the first magnetic field flux pulse, a first energy associated with a first multi-qubit state comprising an excited state of the first superconducting circuit and a state of a second superconducting circuit is substantially equal to a second energy associated with a second multi-qubit state comprising a ground state of the first superconducting circuit and an excited state of the second superconducting circuit.

2. The method of claim 1, where the first superconducting circuit and the second superconducting circuit are capacitively coupled.

3. The method of claim 1, where the state of the second superconducting circuit is either (1) a ground state or (2) a singly-excited state, and where the excited state of the second superconducting circuit is either (1) a singly-excited state or (2) a doubly-excited state.

4. The method of claim 1, further comprising applying an initial magnetic flux through the first inductive loop, before the first magnetic flux pulse begins, with an initial magnetic flux value substantially equal to one half of a magnetic flux quantum, where the magnetic flux quantum is equal to Plank's constant divided by twice the charge of an electron.

5. The method of claim 4, where at least one of the first magnetic flux pulse and the second magnetic flux pulse has a magnetic flux amplitude that is centered around the initial magnetic flux value.

6. The method of claim 1, further comprising modifying both (1) a first effective coupling strength between the first superconducting circuit and a third superconducting circuit, and (2) a second effective coupling strength between the second superconducting circuit and the third superconducting circuit, the modifying comprising:

applying a second magnetic field flux pulse through a second inductive loop associated with the third superconducting circuit.

7. The method of claim 6, where the first effective coupling strength is associated with a first rate at which quantum state population between a first quantum state of the first superconducting circuit and a second quantum state of the third superconducting circuit are transferred, and where the second effective coupling strength is associated with a second rate at which quantum state population between a third quantum state of the third superconducting circuit and a fourth quantum state of the second superconducting circuit are transferred.

8. The method of claim 7, where the second quantum state of the third superconducting circuit and the third quantum state of the third superconducting circuit are the same.

9. The method of claim 6, where the first superconducting circuit and the third superconducting circuit are capacitively coupled, and the second superconducting circuit and the third superconducting circuit are capacitively coupled.

10. The method of claim 6, where the first superconducting circuit and the second superconducting circuit are capacitively coupled.

11. The method of claim 6, where a first duration of the first magnetic field flux pulse and a second duration of the second magnetic field pulse are each based at least in part on the first effective coupling strength and the second effective coupling strength.

12. The method of claim 6, where, during the modifying, at least one of the first effective coupling strength and the second effective coupling strength is greater than or equal to the respective effective coupling strength before the modifying.

13. The method of claim 6, where a quantum state associated with the third superconducting circuit is substantially in a ground state before and after the modifying.

14. The method of claim 6, where the first effective coupling strength and the second effective coupling strength modify a third effective coupling strength between the first superconducting circuit and the second superconducting circuit.

15. The method of claim 14, where the third effective coupling strength is associated with a rate at which quantum state population between a first quantum state of the first superconducting circuit and a second quantum state of the second superconducting circuit are transferred.

16. The method of claim 14, where the quantum gate operation is a two-qubit quantum gate operation acting on a first quantum state associated with the first superconducting circuit and a second quantum state associated with the second superconducting circuit, wherein the two-qubit quantum gate operation temporarily modifies the third effective coupling strength during application of at least one of the first magnetic field flux pulse or the second magnetic field flux pulse.

17. The method of claim 16, further comprising measuring one or more properties associated with at least one of (1) the first quantum state or (2) the second quantum state, after one or more magnetic field flux pulses, and modifying at least one of the first magnetic field flux pulse or the second magnetic field flux pulse based at least in part on the measurement.

18. The method of claim 17, wherein the one or more properties comprise at least one of (1) leakage, (2) a controlled-phase angle, or (3) a rate at which quantum state population is transferred between the first multi-qubit state and the second multi-qubit state.

19. The method of claim 6, wherein applying at least one of the first magnetic field flux pulse or the second magnetic field flux pulse results in a phase shift to a first quantum state associated with the first superconducting circuit that depends at least in part on a second quantum state associated with the second superconducting circuit.

20. The method of claim 6, wherein applying at least one of the first magnetic field flux pulse or the second magnetic field flux pulse applies a quantum gate operation that swaps (1) a first quantum state associated with the first superconducting circuit and (2) a second quantum state associated with the second superconducting circuit.

21. The method of claim 6, where at least one of the first magnetic field flux pulse and the second magnetic field flux pulse has a frequency below 1 GHz.

22. The method of claim 6, further comprising applying a third magnetic field flux pulse through a third inductive loop associated with the second superconducting circuit.

23. The method of claim 22, wherein the first, second, or third magnetic field flux pulses comprise a controlled-phase quantum gate operation associated with the quantum state, wherein an angle associated with the controlled-phase quantum gate operation is determined at least in part on an amplitude of at least one of the first, second, or third magnetic field flux pulses.

24. The method of 6, wherein applying at least one of the first magnetic field flux pulse or the second magnetic field flux pulse applies a quantum gate operation that transfers quantum state population between the first multi-qubit state and the second multi-qubit state.

25. The method of claim 6, further comprising applying one or more single-qubit quantum gate operations to a quantum state associated with the first superconducting circuit, wherein the one or more single-qubit quantum gate operations comprise applying a fourth magnetic field flux pulse through the first inductive loop associated with the first superconducting circuit.

26. The method of claim 6, further comprising determining a program specification comprising one or more quantum gate operations and applying at least one of the first magnetic field flux pulse or the second magnetic field flux pulse based at least in part on the program specification.

27. The method of claim 26, wherein the program specification comprises one or more single-qubit quantum gate operations comprising applying a fourth magnetic field flux pulse through the first inductive loop.

28. The method of claim 27, wherein the one or more single-qubit quantum gate operations are the inverse of a second single-qubit quantum gate operation that is not within the program specification and that results from one or more applied magnetic field flux pulses.

29. The method of claim 28, wherein the fourth magnetic field flux pulse is applied before or after the first magnetic field flux pulse or the second magnetic field flux pulse.

30. The method of claim 27, further comprising applying the fourth magnetic field flux pulse before the first magnetic flux pulse, and performing one or more single-qubit quantum gate operations by applying a fifth magnetic field flux pulse through the first inductive loop after the first magnetic field flux pulse.

31. The method of claim 30, where the fourth magnetic field flux pulse performs a Hadamard quantum gate operation on a quantum state associated with the first superconducting circuit, the first magnetic field flux pulse performs, at least in part, a controlled-Z quantum gate operation associated with the quantum state, and the fifth magnetic field flux pulse performs a Hadamard quantum gate operation on the quantum state.

32. The method of claim 30, wherein the first, fourth, and fifth magnetic field flux pulses comprise a CNOT quantum gate operation associated with the quantum state.

33. The method of claim 26, wherein determining the program specification comprises estimating single-qubit quantum gate operations that occur during application of at least one or more multi-qubit quantum gate operations within the program specification.

34. The method of claim 33, wherein determining the program specification further comprises modifying at least one multi-qubit quantum gate operation based at least in part on the estimated single-qubit quantum gate operation that occurs during the application of the multi-qubit quantum gate operation.

35. An apparatus comprising:
- an array of coupled quantum elements comprising
  - a first superconducting circuit, and
  - a second superconducting circuit; and
- a control module configured to apply magnetic flux pulses to quantum elements in the array of coupled quantum elements, the magnetic flux pulses comprising a first magnetic flux pulse;
- where, during a portion of the first magnetic field flux pulse, a first energy associated with a first multi-qubit state comprising an excited state of the first superconducting circuit and a state of a second superconducting circuit is substantially equal to a second energy associated with a second multi-qubit state comprising a ground state of the first superconducting circuit and an excited state of the second superconducting circuit.

36. The apparatus of claim 35, where the first magnetic field flux pulse is through a first inductive loop associated with the first superconducting circuit.

37. The apparatus of claim 35, where the first superconducting circuit and the second superconducting circuit are capacitively coupled.

38. The apparatus of claim 35, where the first magnetic field flux pulse has a frequency below 1 GHz.

39. The apparatus of claim 35, where the magnetic flux pulses further comprise a second magnetic flux pulse through a second inductive loop associated with a third superconducting circuit.

40. The apparatus of claim 39, where the first superconducting circuit and the third superconducting circuit are capacitively coupled, and the second superconducting circuit and the third superconducting circuit are capacitively coupled.

41. The apparatus of claim 39, where the second magnetic flux pulse modifies at least one of (1) a first effective coupling strength between the first superconducting circuit and the third superconducting circuit, or (2) a second effective coupling strength between the second superconducting circuit and the third superconducting circuit.

42. The apparatus of claim 41, where the first effective coupling strength and the second effective coupling strength modify a third effective coupling strength between the first superconducting circuit and the second superconducting circuit.

43. The apparatus of claim 42, where the third effective coupling strength is associated with a rate at which quantum state population between a first quantum state of the first superconducting circuit and a second quantum state of the second superconducting circuit are transferred.

44. The apparatus of claim 41, where the first effective coupling strength is associated with a first rate at which quantum state population between a first quantum state of the first superconducting circuit and a second quantum state of the third superconducting circuit are transferred, and where the second effective coupling strength is associated with a second rate at which quantum state population between a third quantum state of the third superconducting circuit and a fourth quantum state of the second superconducting circuit are transferred.

45. The apparatus of claim 41, where a quantum state associated with the third superconducting circuit is substantially in a ground state before and after the modifying.

46. The apparatus of claim 35, where the magnetic flux pulses further comprise a third magnetic field flux pulse through a third inductive loop associated with the second superconducting circuit.

47. The apparatus of claim 35, where the magnetic flux pulses perform a two-qubit quantum gate operation acting on a first quantum state associated with the first superconducting circuit and a second quantum state associated with the second superconducting circuit.

* * * * *